US012562738B2

(12) United States Patent
Beck et al.

(10) Patent No.: US 12,562,738 B2
(45) Date of Patent: Feb. 24, 2026

(54) SUPERCONDUCTING RADIO FREQUENCY SIGNAL GENERATORS

(71) Applicant: International Business Machines Corporation, Armonk, NY (US)

(72) Inventors: Matthew Beck, Danbury, CT (US); Ted Thorbeck, Elmsford, NY (US); Joseph Robert Suttle, Chappaqua, NY (US); Santino Carnevale, Stamford, CT (US); Joseph Finley, Rye Brook, NY (US)

(73) Assignee: International Business Machines Corporation, Armonk, NY (US)

( * ) Notice: Subject to any disclaimer, the term of this patent is extended or adjusted under 35 U.S.C. 154(b) by 52 days.

(21) Appl. No.: 18/648,838

(22) Filed: Apr. 29, 2024

(65) Prior Publication Data

US 2025/0337411 A1    Oct. 30, 2025

(51) Int. Cl.
*H03K 17/92* (2006.01)
*H03K 3/03* (2006.01)

(52) U.S. Cl.
CPC ........... *H03K 17/92* (2013.01); *H03K 3/0315* (2013.01)

(58) Field of Classification Search
None
See application file for complete search history.

(56) References Cited

U.S. PATENT DOCUMENTS

| | | | |
|---|---|---|---|
| 7,505,310 B2 | 3/2009 | Nagasawa et al. | |
| 7,991,814 B2 | 8/2011 | Filippov et al. | |
| 10,505,097 B1 | 12/2019 | Inamdar et al. | |
| 10,605,655 B2 | 3/2020 | Zen et al. | |
| 10,637,479 B2 | 4/2020 | Hamilton et al. | |
| 11,115,027 B2 | 9/2021 | Rylov | |
| 11,342,919 B1 | 5/2022 | Whiteley | |
| 11,362,656 B1 | 6/2022 | Beck et al. | |
| 11,411,564 B2 | 8/2022 | Beck et al. | |
| 12,294,369 B2 * | 5/2025 | Yasuda .................... | G06F 1/06 |
| 2001/0025012 A1 | 9/2001 | Tarutani et al. | |
| 2021/0226635 A1 | 7/2021 | Mukhanov et al. | |
| 2023/0239054 A1 | 7/2023 | Nissilä et al. | |
| 2023/0351234 A1 | 11/2023 | Yasuda et al. | |
| 2024/0020562 A1 | 1/2024 | Miano et al. | |

OTHER PUBLICATIONS

L. Chen et al., "A New LFSR Based High-Frequency Test Method for RSFQ Circuit," Superconductivity, Jun. 2022, 5 pages, vol. 2, No. 100011.
G. Krylov et al., "Design for Testability of SFQ Circuits," IEEE Transactions on Applied Superconductivity, Dec. 2017, 7 pages, vol. 27, No. 8.

(Continued)

*Primary Examiner* — Jeffrey S Zweizig
(74) *Attorney, Agent, or Firm* — Erik Johnson; Ryan, Mason & Lewis, LLP

(57) ABSTRACT

A device comprises a superconducting radio frequency (RF) signal generator which comprises a plurality of channels. Each channel is configured to generate a corresponding RF signal with a frequency that is controlled by a corresponding direct current (DC) control signal applied to the channel.

20 Claims, 11 Drawing Sheets

(56) References Cited

OTHER PUBLICATIONS

N. Kito et al., "Conversion of Logic Gates in Netlists for rapid Single Flux Quantum Circuits Utilizing Confluence of Pulses," IPSJ Transactions on System LSI Design Methodology, Aug. 2019, pp. 78-80, vol. 12.

C. Shawawreh et al., "Effects of Adaptive DC Biasing on Operational Margins in ERSFQ Circuits," IEEE Transactions on Applied Superconductivity, Jun. 2017, 6 pages, vol. 27, No. 4.

Z. Liu et al., "SUSHI: Ultra-High-Speed and Ultra-Low-Power Neuromorphic Chip Using Superconducting Single-Flux-Quantum Circuits," MICRO '23: Proceedings of the 56th Annual IEEE/ACM International Symposium on Microarchitecture, Oct. 2023, pp. 614-627.

E. Leonard Jr., et al., "Digital Coherent Control of aSsuperconducting Qubit," arXiv:1806.07930v1, Jun. 20, 2018, 13 pages.

K. Liu et al., "Single-flux-quantum-based Qubit Control with Tunable Driving Strength," arXiv:2307.14140v1, Jul. 26, 2023, 9 pages.

M. A. Castellanos-Beltran et al., "Coherence-limited Digital Control of a Superconducting Qubit using a Josephson Pulse Generator at 3 K," Applied Physics Letters, May 8, 2023, pp. 192602-1 to 192602-6, vol. 122.

Cheng et al., "Superconducting-Oscillatory Neural Network With Pixel Error Detection for Image Recognition", IEEE Transactions on Applied Superconductivity, vol. 33. No. 5, Aug. 2023, 7 pages.

International Search Report and Written Opinion for International Application No. PCT/EP2025/059642 dated Jul. 28, 2025, 15 pages.

* cited by examiner

Figure 11:
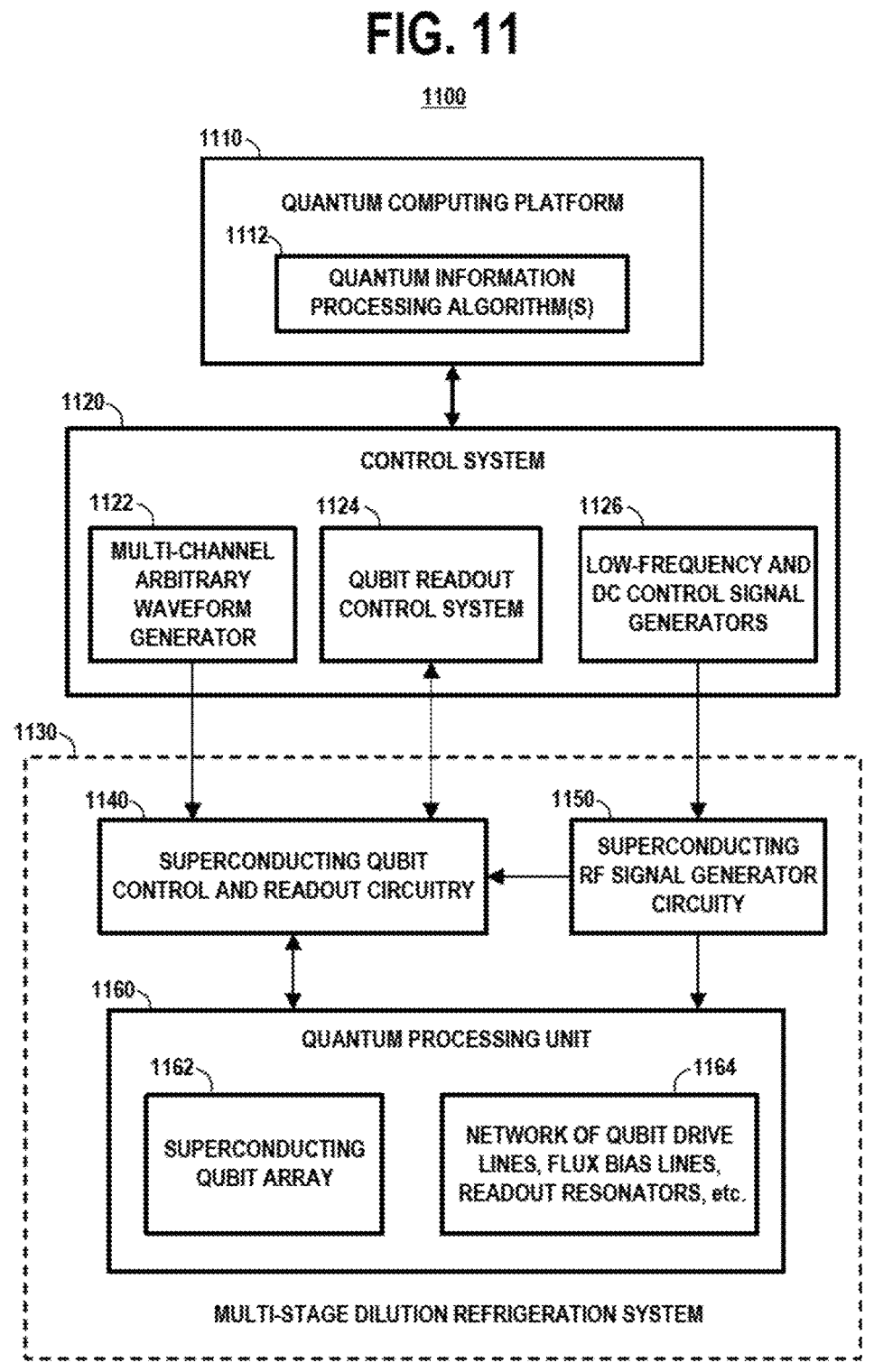

QUANTUM COMPUTING PLATFORM

1112

QUANTUM INFORMATION PROCESSING ALGORITHM(S)

1120

CONTROL SYSTEM

1122

MULTI-CHANNEL ARBITRARY WAVEFORM GENERATOR

1124

QUBIT READOUT CONTROL SYSTEM

1126

LOW-FREQUENCY AND DC CONTROL SIGNAL GENERATORS

1130

1140

SUPERCONDUCTING QUBIT CONTROL AND READOUT CIRCUITRY

1150

SUPERCONDUCTING RF SIGNAL GENERATOR CIRCUITY

1160

QUANTUM PROCESSING UNIT

1162

SUPERCONDUCTING QUBIT ARRAY

1164

NETWORK OF QUBIT DRIVE LINES, FLUX BIAS LINES, READOUT RESONATORS, etc.

MULTI-STAGE DILUTION REFRIGERATION SYSTEM

SUPERCONDUCTING RADIO FREQUENCY SIGNAL GENERATORS

BACKGROUND

This disclosure relates generally to quantum computing and, in particular, to techniques for generating radio frequency (RF) signals for operating quantum circuit components and devices in superconducting quantum computing systems. A quantum computing system can be implemented using superconducting circuit quantum electrodynamics (cQED) architectures that are constructed using quantum circuit components such as, e.g., superconducting quantum bits and other types of superconducting quantum devices that are controlled using microwave control signals. In general, superconducting quantum bits (qubits) are electronic circuits which are implemented using components such as superconducting tunnel junctions (e.g., Josephson junctions), inductors, and/or capacitors, etc., and which behave as quantum mechanical anharmonic (non-linear) oscillators with quantized states, when cooled to cryogenic temperatures.

The cryogenic hardware that is utilized to implement a quantum computer with superconducting qubits requires a variety of microwave components including, e.g., qubit couplers, microwave filters, quantum limited amplifiers, Josephson parametric frequency converters and mixers, isolators, switches, and other microwave components that are implemented in qubit control and readout signal paths etc., which are controlled using various microwave control signals (e.g., RF control pulses, RF pump signals, etc.). The cryogenic hardware is disposed on a base stage (e.g., millikelvin (mK) stage) of a dilution refrigerator (in a cryogenic environment), wherein microwave control signals generated by electronics operating in a non-cryogenic environment (e.g., room temperature, 300 K) are transmitted via high bandwidth lines that extend from the room temperature electronics through the dilution refrigerator to the cryogenic hardware in the base stage.

The transmission and delivery of microwave control signals in a superconducting quantum computing system is typically performed in a coarse manner where, for example, individual superconducting qubits and other quantum devices are controlled by independent stand-alone microwave drive lines. However, the number of high-bandwidth control lines for transmitting microwave control signals from the room temperature electronics to the mK stage of the dilution refrigerator scales linearly as a function of quantum device count. As a consequence, the increasing number of high-bandwidth control lines that must extend through the dilution refrigerator to support the increasing number of quantum devices to be controlled poses a limitation to quantum system scaling and integration.

SUMMARY

Exemplary embodiments of the disclosure include superconducting RF signal generators and techniques for generating continuous, single frequency RF signals that are utilized, for example, to operate superconducting quantum devices and circuits of a quantum computing system.

An exemplary embodiment includes a device which comprises a superconducting RF signal generator which comprises a plurality of channels. Each channel is configured to generate a corresponding RF signal with a frequency that is controlled by a corresponding direct current (DC) control signal applied to the channel.

Another exemplary embodiment includes a device which comprises a plurality of superconducting quantum devices, and a superconducting RF signal generator. The superconducting RF signal generator comprises a plurality of channels, a pulse generator circuit, and a pulse splitter tree. The pulse generator circuit is configured to generate a single flux quantum (SFQ) control pulse in response to one cycle of an RF control signal applied to the pulse generator circuit. The pulse splitter tree is configured to split and distribute the SFQ control pulse to an input of each channel of the plurality of channels of the superconducting RF signal generator. In response to the SFQ control pulse, each channel is configured to: generate a series of SFQ pulses with a pulse-to-pulse spacing that is based on a magnitude of a corresponding DC control signal that is applied to the channel; filter the series of SFQ pulses to generate a RF signal with a frequency that corresponds to the pulse-to-pulse spacing of the series of SFQ pulses; and apply the RF signal to at least one superconducting quantum device of the plurality of superconducting quantum devices.

Another exemplary embodiment includes a system which comprises a plurality of superconducting quantum devices, a superconducting RF signal generator, and a control system. The control system is coupled to the superconducting RF signal generator by an RF control line and a plurality of direct current (DC) control lines. The control system is configured to control operation of the superconducting RF signal generator. The superconducting RF signal generator comprises a plurality of channels, a pulse generator circuit configured to generate an SFQ control pulse in response to one cycle of an RF control signal which is generated by the control system and applied to the pulse generator circuit on the RF control line. The pulse splitter tree is configured to split and distribute the SFQ control pulse to an input of each channel of the plurality of channels of the superconducting RF signal generator. In response to the SFQ control pulse, each channel is configured to: generate a series of SFQ pulses with a pulse-to-pulse spacing that is based on a magnitude of a corresponding DC control signal that is applied to the channel on a corresponding DC control line of the plurality of DC control lines; filter the series of SFQ pulses to generate a RF signal with a frequency that corresponds to the pulse-to-pulse spacing of the series of SFQ pulses; and apply the RF signal to at least one superconducting quantum device of the plurality of superconducting quantum devices.

Other embodiments will be described in the following detailed description of exemplary embodiments, which is to be read in conjunction with the accompanying figures.

BRIEF DESCRIPTION OF THE DRAWINGS

FIG. 11 schematically illustrates a quantum computing system which comprises superconducting RF signal generator circuitry, according to an exemplary embodiment of the disclosure.

DETAILED DESCRIPTION

Figure 1A:
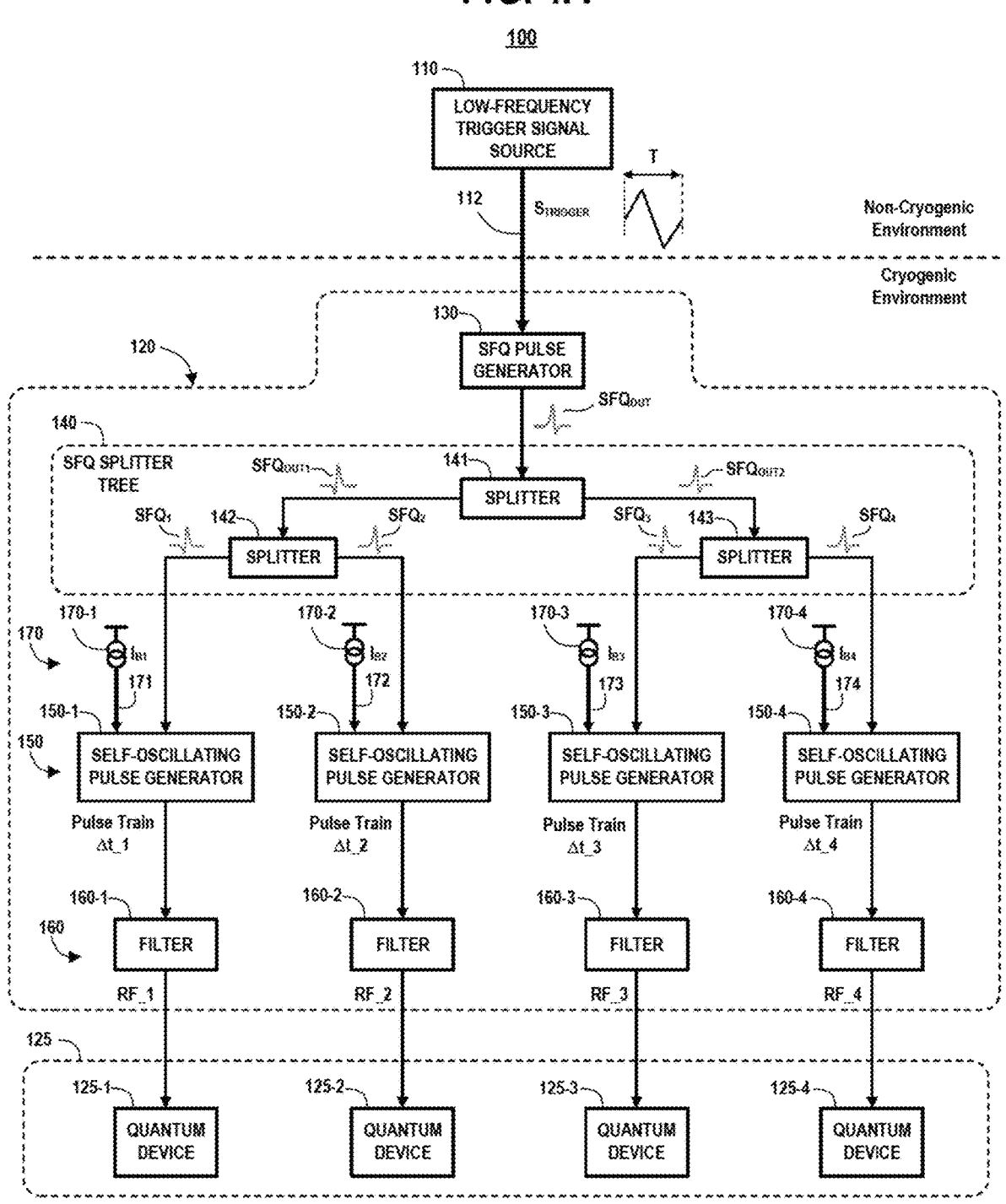
FIG. 1A schematically illustrates a quantum computing system which comprises a superconducting RF signal generator, according to an exemplary embodiment of the disclosure.

Exemplary embodiments of the disclosure will now be described in further detail with regard to superconducting RF signal generators and techniques for generating RF signals for operating quantum circuit components and devices of a quantum computing system. The exemplary RF signal generators are implemented using superconducting circuitry which is configured to operate in cryogenic environments (e.g., in a cryostat or dilution refrigerator) to generate RF signals using single flux quantum (SFQ) pulses and associated SFQ circuitry, such as direct current (DC)-powered SFQ circuitry such as rapid single flux quantum (RSFQ) circuitry and energy-efficient rapid single flux quantum (ERSFQ) circuitry.

As is known in the art, an SFQ pulse (also referred to as magnetic single flux quantum pulse) is a voltage pulse whose time integral is equal to a discrete amount of magnetic flux, i.e., a single magnetic flux quantum, referred to herein as a "fluxon." More specifically, an SFQ pulse comprises a voltage pulse having a small magnitude (e.g., 1 millivolt (mV)) and a short duration (e.g., 2 picoseconds), wherein an area of the SFQ pulse (i.e., integral of voltage over time) is equal to one magnetic flux quantum $\Phi_0$ (or one fluxon), where $\Phi_0 = h/(2e) \approx 2.07 \times 10^{-15}$ Weber (volt-seconds), where h is Planck's constant, and e denotes a magnitude of electron charge. As is known in the art, the magnetic flux quantum $\Phi_0$ is a fundamental unit of magnetic flux which represents a quantization of magnetic flux threading a superconducting loop. In this regard, an SFQ pulse is any voltage pulse having a magnitude (in millivolts) and duration (picoseconds) such that the integral of the magnitude (voltage) over the duration (time) of the SFQ pulse (i.e., quantized area of SFQ pulse) is substantially equal to $\Phi_0 = 2.07$ millivolt-picosecond (or 2.07 mA-pH), which equates to one superconducting magnetic flux quantum (or one fluxon).

In an exemplary embodiment, a device comprises a superconducting RF signal generator. The superconducting RF signal generator comprises a plurality of channels. Each channel is configured to generate a corresponding RF signal with a frequency that is controlled by a corresponding direct current (DC) control signal applied to the channel.

Advantageously, a superconducting RF signal generator is configured to generate a plurality of continuous, single frequency, RF signals within a cryostat or dilution refrigerator based on DC control signals, which eliminates the need to route individual high-bandwidth lines from a non-cryogenic environment to a cryogenic environment to operate quantum devices, quantum circuits, or other devices/circuits in the cryogenic environment.

In another exemplary embodiment, which may be combined with one or more of the embodiments of the preceding paragraphs, the superconducting RF signal generator comprises a pulse generator circuit, and a pulse splitter tree. The pulse generator circuit is configured to generate a control pulse in response to one cycle of an RF control signal applied to the pulse generator circuit. The pulse splitter tree is configured to split and distribute the control pulse to an input of each channel. In response to the control pulse, each channel is configured to generate a series of pulses with a pulse-to-pulse spacing that is based on a magnitude of the corresponding DC control signal applied to the channel, and to filter the series of pulses to generate an RF signal with a frequency that corresponds to the pulse-to-pulse spacing of the series of pulses.

In another exemplary embodiment, which may be combined with one or more of the embodiments of the preceding paragraphs, each channel comprises a self-oscillating pulse generator circuit, and a filter circuit. The self-oscillating pulse generator circuit is configured to generate a series of pulses with a pulse-to-pulse spacing that is based on a magnitude of the corresponding DC control signal applied to the channel. The filter circuit is configured to filter the series of pulses generated by the self-oscillating pulse generator circuit, and output an RF signal with a single frequency that corresponds to the pulse-to-pulse spacing of the series of pulses.

In another exemplary embodiment, which may be combined with one or more of the embodiments of the preceding paragraphs, the pulse generator circuit is configured to generate an SFQ pulse as the control pulse.

In another exemplary embodiment, which may be combined with one or more of the embodiments of the preceding paragraphs, each channel is configured to generate a series of SFQ pulses in response to the control pulse input to the channel.

In another exemplary embodiment, which may be combined with one or more of the embodiments of the preceding paragraphs, each channel comprises a self-oscillating pulse generator circuit, and a filter circuit. The self-oscillating pulse generator circuit is configured to generate a series of pulses with a pulse-to-pulse spacing that is based on a magnitude of the corresponding DC control signal applied to the channel. The filter circuit is configured to filter the series of pulses generated by the self-oscillating pulse generator circuit, and output an RF signal with a single frequency that corresponds to the pulse-to-pulse spacing of the series of pulses.

In another exemplary embodiment, which may be combined with one or more of the embodiments of the preceding paragraphs, the self-oscillating pulse generator circuit comprises a Josephson ring oscillator circuit which is configured to generate a series of single flux quantum (SFQ) pulses with the pulse-to-pulse spacing that is based on the magnitude of the corresponding DC control signal applied to the channel, and the corresponding DC control signal is input to the Josephson ring oscillator circuit to cause the Josephson ring oscillator circuit to set the pulse-to-pulse spacing based on the magnitude of the corresponding DC control signal.

In another exemplary embodiment, which may be combined with one or more of the embodiments of the preceding paragraphs, the Josephson ring oscillator circuit comprises: a pulse input port; a pulse output port; a control signal port; a confluence buffer circuit; a first Josephson transmission line; a second Josephson transmission line; and a pulse splitter circuit. The confluence buffer circuit comprises a first input port coupled to the pulse input port of the Josephson ring oscillator circuit, a second input port coupled to an output port of the second Josephson transmission line, and an output port coupled to an input port of the first Josephson transmission line. The first Josephson transmission line comprises an output port coupled to an input port of the pulse splitter circuit. The pulse splitter circuit comprises a first output port coupled to the pulse output port of the Josephson ring oscillator circuit, and a second output port coupled to an input port of the second Josephson transmission line. The control signal port of the Josephson ring oscillator circuit is coupled to a bias current input port of the second Josephson transmission line, and configured to receive the corresponding DC control signal.

In another exemplary embodiment, which may be combined with one or more of the embodiments of the preceding paragraphs, at least one channel of the plurality of channels is configured to generate a corresponding RF signal which is applied to an input of a quantum device.

In another exemplary embodiment, a device comprises a plurality of superconducting quantum devices, and a superconducting RF generator. The superconducting RF signal generator comprises a plurality of channels, a pulse generator circuit, and a pulse splitter tree. The pulse generator circuit is configured to generate an SFQ control pulse in response to one cycle of an RF control signal applied to the pulse generator circuit. The pulse splitter tree is configured to split and distribute the SFQ control pulse to an input of each channel of the plurality of channels of the superconducting RF signal generator. In response to the SFQ control pulse, each channel is configured to: generate a series of SFQ pulses with a pulse-to-pulse spacing that is based on a magnitude of a corresponding DC control signal that is applied to the channel; filter the series of SFQ pulses to generate a RF signal with a frequency that corresponds to the pulse-to-pulse spacing of the series of SFQ pulses; and apply the RF signal to at least one superconducting quantum device of the plurality of superconducting quantum devices.

In another exemplary embodiment, which may be combined with one or more of the embodiments of the preceding paragraphs, each channel of the superconducting RF signal generator comprises a self-oscillating pulse generator circuit, and a filter circuit. In response to the SFQ control pulse, the self-oscillating pulse generator circuit is configured to generate the series of SFQ pulses with the pulse-to-pulse spacing that is based on the magnitude of the corresponding DC control signal applied to the channel. The filter circuit is configured to filter the series of SFQ pulses generated by the self-oscillating pulse generator circuit, and output an RF signal with a frequency that corresponds to the pulse-to-pulse spacing of the series of SFQ pulses.

In another exemplary embodiment, which may be combined with one or more of the embodiments of the preceding paragraphs, the self-oscillating pulse generator circuit comprises a Josephson ring oscillator circuit, and the corresponding DC control signal comprises a DC bias current that is input to the Josephson ring oscillator circuit to cause the Josephson ring oscillator circuit to set the pulse-to-pulse spacing of the series of SFQ pulses based on the magnitude of the DC bias current.

In another exemplary embodiment, which may be combined with one or more of the embodiments of the preceding paragraphs, the Josephson ring oscillator circuit comprises: a pulse input port; a pulse output port; a control signal port; a confluence buffer circuit; a first Josephson transmission line; a second Josephson transmission line; and a pulse splitter circuit. The confluence buffer circuit comprises a first input port coupled to the pulse input port of the Josephson ring oscillator circuit, a second input port coupled to an output port of the second Josephson transmission line, and an output port coupled to an input port of the first Josephson transmission line. The first Josephson transmission line comprises an output port coupled to an input port of the pulse splitter circuit. The pulse splitter circuit comprises a first output port coupled to the pulse output port of the Josephson ring oscillator circuit, and a second output port coupled to an input port of the second Josephson transmission line. The control signal port of the Josephson ring oscillator circuit is coupled to a bias current input port of the second Josephson transmission line, and configured to receive the corresponding DC control signal.

In another exemplary embodiment, which may be combined with one or more of the embodiments of the preceding paragraphs, at least one channel of the plurality of channels is configured to generate a corresponding RF signal which is applied to an input of at least one quantum device coupled to the at least one channel.

Another exemplary embodiment includes a system which comprises a plurality of superconducting quantum devices, a superconducting RF signal generator, and a control system. The control system is coupled to the superconducting RF signal generator by an RF control line and a plurality of DC control lines. The control system is configured to control operation of the superconducting RF signal generator. The superconducting RF signal generator comprises a plurality of channels, a pulse generator circuit, and a pulse splitter tree. The pulse generator circuit is configured to generate an SFQ control pulse in response to one cycle of an RF control signal which is generated by the control system and applied to the pulse generator circuit on the RF control line. The pulse splitter tree is configured to split and distribute the SFQ control pulse to an input of each channel of the plurality of channels of the superconducting RF signal generator. In response to the SFQ control pulse, each channel is configured to: generate a series of SFQ pulses with a pulse-to-pulse spacing that is based on a magnitude of a corresponding DC control signal that is applied to the channel on a corresponding DC control line of the plurality of DC control lines; filter the series of SFQ pulses to generate a RF signal with a frequency that corresponds to the pulse-to-pulse spacing of the series of SFQ pulses; and apply the RF signal to at least one superconducting quantum device of the plurality of superconducting quantum devices.

In another exemplary embodiment, which may be combined with one or more of the embodiments of the preceding paragraphs, the plurality of superconducting quantum devices and the superconducting RF signal generator are disposed in a cryogenic temperature environment, and the control system is disposed in a non-cryogenic temperature environment.

In another exemplary embodiment, which may be combined with one or more of the embodiments of the preceding paragraphs, at least one channel of the plurality of channels of the superconducting RF signal generator is configured to generate a corresponding RF signal which is applied to an input of at least one quantum device coupled to the at least one channel.

In another exemplary embodiment, which may be combined with one or more of the embodiments of the preceding paragraphs, each channel of the superconducting RF signal generator comprises a self-oscillating pulse generator circuit, and a filter circuit. In response to the SFQ control pulse, the self-oscillating pulse generator circuit configured to generate the series of SFQ pulses with the pulse-to-pulse spacing that is based on the magnitude of the corresponding DC control signal applied to the channel on the corresponding DC control line. The filter circuit is configured to filter the series of SFQ pulses generated by the self-oscillating pulse generator circuit, and output an RF signal with a frequency that corresponds to the pulse-to-pulse spacing of the series of SFQ pulses.

In another exemplary embodiment, which may be combined with one or more of the embodiments of the preceding paragraphs, the self-oscillating pulse generator circuit comprises a Josephson ring oscillator circuit, and the corresponding DC control signal comprises a DC bias current that is input to the Josephson ring oscillator circuit to cause the Josephson ring oscillator circuit to set the pulse-to-pulse spacing of the series of SFQ pulses based on the magnitude of the DC bias current.

In another exemplary embodiment, which may be combined with one or more of the embodiments of the preceding paragraphs, the Josephson ring oscillator circuit comprises: a pulse input port; a pulse output port; a control signal port; a confluence buffer circuit; a first Josephson transmission line; a second Josephson transmission line; and a pulse splitter circuit. The confluence buffer circuit comprises a first input port coupled to the pulse input port of the Josephson ring oscillator circuit, a second input port coupled to an output port of the second Josephson transmission line, and an output port coupled to an input port of the first Josephson transmission line. The first Josephson transmission line comprises an output port coupled to an input port of the pulse splitter circuit. The pulse splitter circuit comprises a first output port coupled to the pulse output port of the Josephson ring oscillator circuit, and a second output port coupled to an input port of the second Josephson transmission line. The control signal port of the Josephson ring oscillator circuit is coupled to a bias current input port of the second Josephson transmission line, and configured to receive the corresponding DC control signal.

In another exemplary embodiment, which may be combined with one or more of the embodiments of the preceding paragraphs, the Josephson ring oscillator circuit is configured to amplify the series of SFQ pulses.

It is to be understood that the various features shown in the accompanying drawings are schematic illustrations that are not drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the term "exemplary" as used herein means "serving as an example, instance, or illustration." Any embodiment or design described herein as "exemplary" is not to be construed as preferred or advantageous over other embodiments or designs.

Further, it is to be understood that the phrase "configured to" as used in conjunction with a circuit, structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, wherein the hardware may comprise superconducting quantum devices (e.g., quantum processors, quantum bits, Josephson junctions, Josephson ring modulators, quantum-limited amplifiers (QLAs), qubit couplers, microwave switches, isolator circuits, etc.), discrete circuit elements (e.g., transistors, inverters, etc.), programmable elements (e.g., application specific integrated circuit (ASIC) chips, field-programmable gate array (FPGA) chips, etc.), processing devices (e.g., central processing units (CPUs), graphics processing units (GPUs), etc.), one or more integrated circuits, and/or combinations thereof. Thus, by way of example only, when a circuit, structure, element, component, etc., is defined to be configured to provide a specific functionality, it is intended to cover, but not be limited to, embodiments where the circuit, structure, element, component, etc., is comprised of elements, processing devices, and/or integrated circuits that enable it to perform the specific functionality when in an operational state (e.g., connected or otherwise deployed in a system, powered on, receiving an input, and/or producing an output), as well as cover embodiments when the circuit, structure, element, component, etc., is in a non-operational state (e.g., not connected nor otherwise deployed in a system, not powered on, not receiving an input, and/or not producing an output) or in a partial operational state.

FIG. 1A schematically illustrates a quantum computing system which comprises a superconducting RF signal generator, according to an exemplary embodiment of the disclosure. In particular, FIG. 1A schematically illustrates a quantum computing system 100 which comprises a low-frequency trigger signal source 110, superconducting RF signal generator circuitry 120, and a plurality of quantum devices 125. The superconducting RF signal generator circuitry 120 comprises an SFQ pulse generator 130, an SFQ pulse splitter tree 140, a plurality of self-oscillating pulse generators 150, and a plurality of filters 160. The SFQ pulse splitter tree 140 comprises a first pulse splitter 141, and second pulse splitter 142, and a third pulse splitter 143 (e.g., RSFQ splitters). The plurality of self-oscillating pulse generators 150 comprises a first self-oscillating pulse generator 150-1, a second self-oscillating pulse generator 150-2, a third self-oscillating pulse generator 150-3, and a fourth self-oscillating pulse generator 150-4. The plurality of filters 160 comprises a first filter 160-1, a second filter 160-2, a third filter 160-3, and a fourth filter 160-4.

The quantum computing system 100 further comprises a plurality of DC bias current generators 170 including a first DC bias current generator 170-1, a second DC bias current generator 170-2, a third DC bias current generator 170-3, and a fourth DC bias current generator 170-4, and corresponding low-bandwidth (or DC) control lines, e.g., a first control line 171, a second control line 172, a third control line 173, and a fourth control line 174. The first DC bias current generator 170-1 is configured to generate a first DC bias current $I_{B1}$ (which is applied to the first control line 171) to control the operation of the first self-oscillating pulse generator 150-1. The second DC bias current generator 170-2 is configured to generate a second DC bias current $I_{B2}$ (which is applied to the second control line 172) to control the operation of the second self-oscillating pulse generator 150-2. The third DC bias current generator 170-3 is configured to generate a third DC bias current $I_{B3}$ (which is applied to the third control line 173) to control the operation of the third self-oscillating pulse generator 150-3. The fourth DC bias current generator 170-4 is configured to generate a fourth DC bias current $I_{B4}$ (which is applied to the fourth control line 174) to control the operation of the fourth self-oscillating pulse generator 150-4.

While the DC bias current generators 170 are generically depicted in FIG. 1A, it is to be understood that each of the DC bias current generators 170 can be implemented using an RSFQ bias circuit or an ERSFQ bias circuit, as is known in the art. In some embodiments, the control lines 171, 172, 173, and 174 each comprise an in-line (series) low-pass filter (with a cutoff frequency of e.g., 1 kHz), which is disposed in proximity to the DC bias current input ports of the self-oscillating pulse generators 150-1, 150-2, 150-3, and 150-4, so as to filter out any noise on the control lines 171, 172, 173, and 174.

The low-frequency trigger signal source 110 is configured to generate one cycle (or one 2 rotation) of a low-frequency trigger signal (denoted $S_{TRIGGER}$), which is transmitted on, e.g., a high bandwidth signal line 112, and input to the superconducting RF signal generator circuitry 120. In an exemplary embodiment, the low-frequency trigger signal source 110 comprises an analog circuit which is disposed in a non-cryogenic temperature environment (e.g., room temperature (RT) environment of e.g., 300 Kelvin), while the superconducting RF signal generator circuitry 120 is disposed in a cryogenic temperature environment (e.g., 4 Kelvin or lower). The low-frequency trigger signal $S_{TRIGGER}$ is applied to the input port of the SFQ pulse generator 130. The SFQ pulse generator 130 is configured to generate and output a single SFQ pulse (denoted $SFQ_{OUT}$) in response to $S_{TRIGGER}$. In an exemplary embodiment, as shown in FIG. 1A, the low-frequency trigger signal $S_{TRIGGER}$ can be a triangular-shaped signal with a period T that corresponds to a frequency in a range of, e.g., 1 Hz to 1 KHz. In this regard, the operation of the superconducting RF signal generator circuitry 120 is triggered/initiated in response to the single 2× rotation of the low-frequency trigger signal $S_{TRIGGER}$ that is applied to the SFQ pulse generator 130 (from the single high-bandwidth signal line 112), which causes the SFQ pulse generator 130 to generate the single SFQ pulse ($SFQ_{OUT}$). An exemplary embodiment of the SFQ pulse generator 130 will be discussed in detail below in conjunction with FIG. 6.

In response to the single SFQ pulse ($SFQ_{OUT}$), the superconducting RF signal generator circuitry 120 is configured to generate a plurality of continuous RF output signals, e.g., RF_1, RF_2, RF_3, and RF_4, at GHz frequencies, to operate the respective quantum devices 125-1, 125-2, 125-3, and 125-4. More specifically, as schematically illustrated in FIG. 1A, the pulse $SFQ_{OUT}$ is applied to an input port of the first pulse splitter 141. The first pulse splitter 141 is configured to split the pulse $SFQ_{OUT}$ into first and second pulses $SFQ_{OUT1}$ and $SFQ_{OUT2}$, with a negligible decrease in the voltage amplitude of the SFQ pulses. The first pulse $SFQ_{OUT}$ is applied to an input of the second pulse splitter 142, and the second pulse $SFQ_{OUT2}$ is applied to an input of the third pulse splitter 143. The second pulse splitter 142 is configured to split the pulse $SFQ_{OUT1}$ into a first pulse $SFQ_1$ and a second pulse $SFQ_2$. Similarly, the third pulse splitter 143 is configured to split the pulse $SFQ_{OUT2}$ into a third pulse $SFQ_3$ and a fourth pulse $SFQ_4$.

Figures 3, 4:
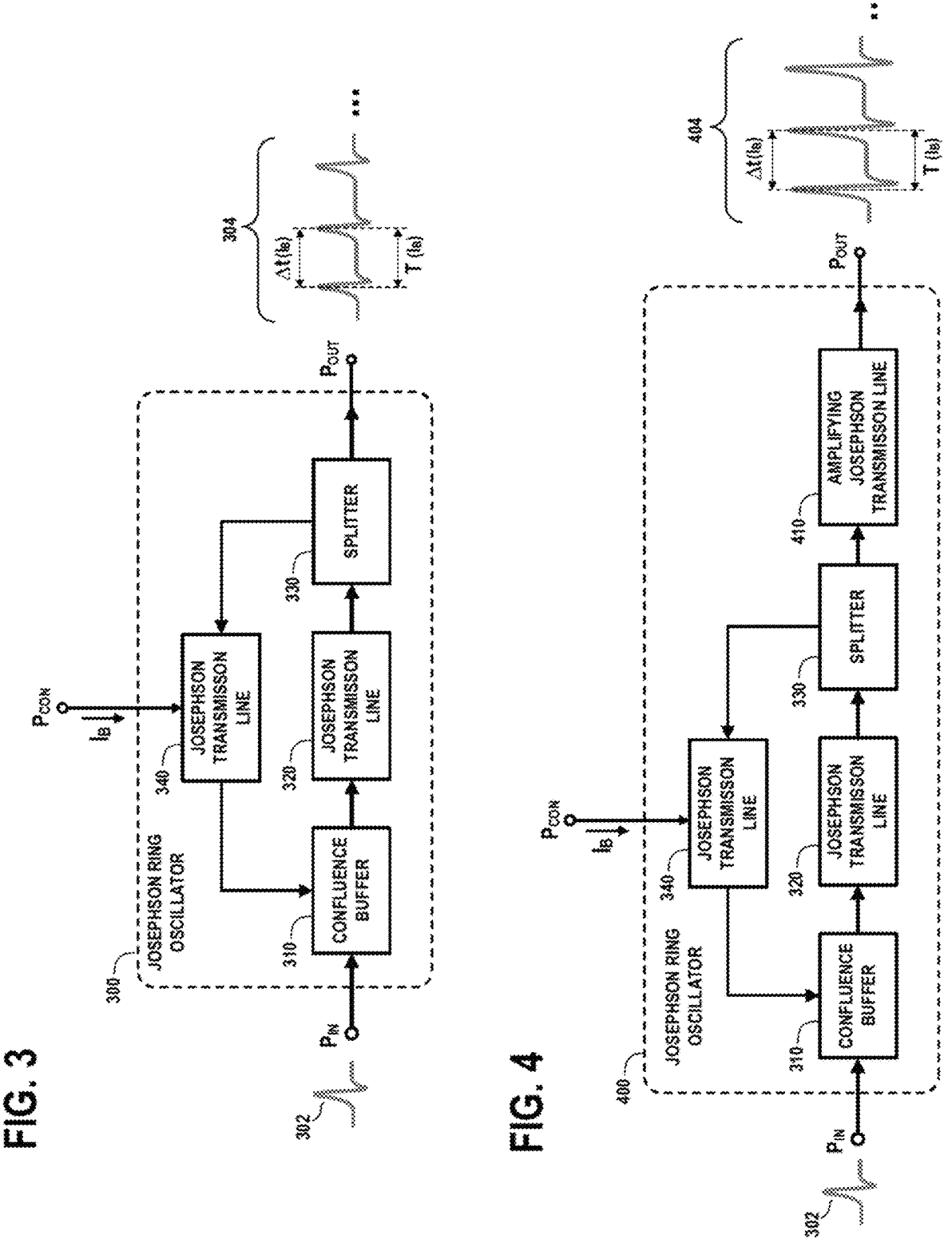
FIG. 3 schematically illustrates a self-oscillating pulse generator circuit which can be implemented in a superconducting RF signal generator, according to an exemplary embodiment of the disclosure.
FIG. 4 schematically illustrates a self-oscillating pulse generator circuit which can be implemented in a superconducting RF signal generator, according to another exemplary embodiment of the disclosure.

In some embodiments, as schematically shown in FIG. 1A, the SFQ pulse splitter tree 140 comprises a balanced splitter tree structure comprising n levels of pulse splitters (n-level splitter tree), with a total of $n^2-1$ splitters (e.g., n=2, as shown in FIG. 1A), which is configured to distribute a single SFQ pulse (e.g., $SFQ_{OUT}$) to $n^2$ fanout nodes which, as shown in FIG. 4 comprise four (4) fanout nodes which output multiple SFQ pulses including the first pulse $SFQ_1$, the second pulse $SFQ_2$, the third pulse $SFQ_3$, and the fourth pulse $SFQ_4$. In other words, the exemplary two-level SFQ pulse spitter tree 140 generates four SFQ pulses (e.g., $SFQ_1$, $SFQ_2$, $SFQ_3$, and $SFQ_4$) in response to one SFQ pulse (e.g., $SFQ_{OUT}$).

Figure 2:
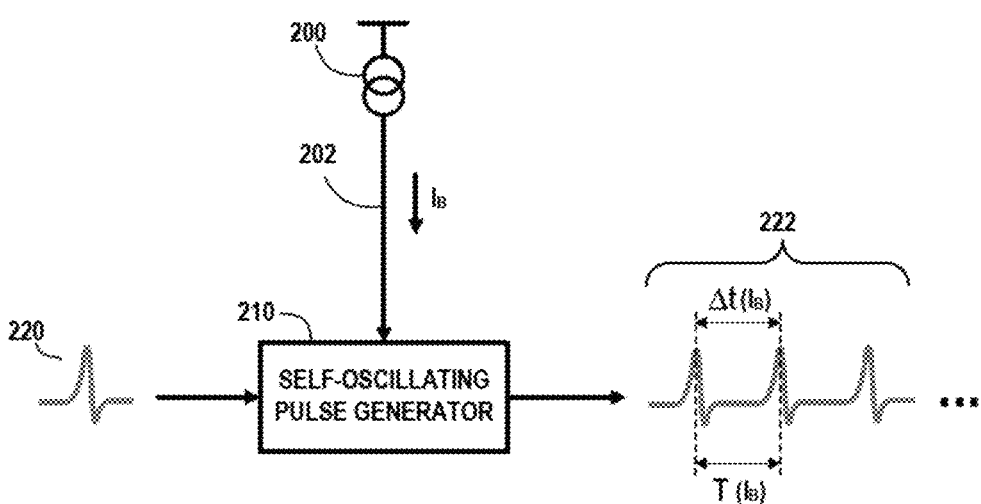
FIG. 2 schematically illustrates a mode of operation of a self-oscillating pulse generator of a superconducting RF signal generator, according to an exemplary embodiment of the disclosure.

The self-oscillating pulse generators 150 are each configured to self-oscillate and generate a series of SFQ pulses (alternatively referred to as pulse train or SFQ pulse train) with a pulse-to-pulse spacing denoted $\Delta t$ (alternatively, period of oscillation (T)), in response to an SFQ pulse applied to the input of the self-oscillating pulse generator. The period of free oscillation is controlled by the magnitude of the DC bias current that is applied to the self-oscillating pulse generator. For example, FIG. 2 schematically illustrates an exemplary mode of operation of a given self-oscillating pulse generator of the superconducting RF signal generator circuitry 120, according to an exemplary embodiment of the disclosure. In particular, FIG. 2 schematically illustrates a DC bias current generator 200 which generates a DC bias current $I_B$ that is applied on a control line 202 (low bandwidth control line) which is coupled to a control input of a self-oscillating pulse generator 210. In an exemplary embodiment, the DC bias current generator 200 is disposed in a room temperature environment, wherein the control line 202 is routed from room temperature electronics to the self-oscillating pulse generator 210 disposed in a cryogenic temperature environment (e.g., 4K or less).

FIG. 2 schematically illustrates that in response to one SFQ pulse 220 applied to an input of the self-oscillating pulse generator 210, the self-oscillating pulse generator 210 generates a series of SFQ pulses 222 (or pulse train 222) with a pulse-to-pulse spacing $\Delta t$ (or period of oscillation T) which is a function of the magnitude of the DC bias current $I_B$, i.e., $\Delta t$ ($I_B$). In an exemplary embodiment, the self-oscillating pulse generator 210 is configured to generate the pulse train 222 with a pulse-to-pulse spacing $\Delta t$ that decreases with an increase in the magnitude of the DC bias current $I_B$ and, conversely, a pulse-to-pulse spacing $\Delta t$ that increases with a decrease in the magnitude of the DC bias current $I_B$. Exemplary embodiments of a self-oscillating pulse generator will be discussed in further detail in conjunction with FIGS. 3 and 4.

Referring back to FIG. 1A, as schematically shown, the first, second, third, and fourth pulses $SFQ_1$, $SFQ_2$, $SFQ_3$, and $SFQ_4$ are applied to respective inputs ports of the first, second, third, and fourth self-oscillating pulse generators 150-1, 150-2, 150-3, and 150-4. In response to the first pulse $SFQ_1$, the first self-oscillating pulse generator 150-1 self-oscillates and generates an SFQ pulse train with a pulse-to-pulse spacing of $\Delta t\_1$ based on the magnitude of the first DC bias current $I_{B1}$. In response to the second pulse $SFQ_2$, the second self-oscillating pulse generator 150-2 self-oscillates and generates an SFQ pulse train with a pulse-to-pulse spacing of Δt_2 based on the magnitude of the second DC bias current $I_{B2}$. In response to the third pulse SFQ$_3$, the third self-oscillating pulse generator 150-3 self-oscillates and generates an SFQ pulse train with a pulse-to-pulse spacing of Δt_3 based on the magnitude of the third DC bias current $I_{B3}$. In response to the fourth pulse SFQ$_4$, the fourth self-oscillating pulse generator 150-3 self-oscillates and generates an SFQ pulse train with a pulse-to-pulse spacing of Δt_4 based on the magnitude of the fourth DC bias current $I_{B4}$.

With the exemplary configuration of FIG. 1A, the first, second, third, and fourth self-oscillating pulse generators 150-1, 150-2, 150-3, and 150-4 can be configured to generate pulse trains with different pulse-to-pulse spacings (Δt_1, Δt_2, Δt_3, and Δt_4) to achieve different output frequencies RF_1, RF_2, RF_3, and RF_4, by applying the respective first, second, third, and fourth DC bias currents $I_{B1}$, $I_{B2}$, $I_{B3}$, and $I_{B4}$ with different magnitudes. It is to be noted that a "comb" (pulse train) of SFQ pulses in the time domain corresponds to a comb of frequencies in the frequency domain. In other words, the Fourier transform of a series of SFQ pulses (similar to delta pulses) in time, with a given pulse-to-pulse spacing Δt, or pulse period T, results in plurality of frequencies in the frequency domain, including (i) a fundamental (target) frequency (f) which corresponds to the pulse period T as:

$$f = \frac{1}{T}\left(\text{or } f = \frac{1}{\Delta t}\right),$$

and (ii) harmonics of the fundamental frequency (e.g., 2f, 3f, 4f, etc.).

The filters 160 are configured to (i) receive the SFQ pulse trains that are output from the respective self-oscillating pulse generators 150, (ii) filter out unwanted RF frequencies, and (iii) output respective continuous RF signals each having a single RF frequency. In particular, as schematically shown, the SFQ pulse train with the pulse-to-pulse spacing of Δt_1 (output from the first self-oscillating pulse generator 150-1) is applied to the first filter 160-1, wherein the SFQ pulse train is filtered to generate a continuous RF signal (RF_1) having a frequency $$f_1 = \frac{1}{\Delta t\_1}.$$

The SFQ pulse train with the pulse-to-pulse spacing of Δt_2 (output from the second self-oscillating pulse generator 150-2) is applied to the second filter 160-2, wherein the SFQ pulse train is filtered to generate a continuous RF signal (RF_2) having a frequency $$f_2 = \frac{1}{\Delta t\_2}.$$

The SFQ pulse train with the pulse-to-pulse spacing of Δt_3 (output from the third self-oscillating pulse generator 150-3) is applied to the third filter 160-3, wherein the SFQ pulse train is filtered to generate a continuous RF signal (RF_3) having a frequency $$f_3 = \frac{1}{\Delta t\_3}.$$

The SFQ pulse train with the pulse-to-pulse spacing of Δt_4 (output from the fourth self-oscillating pulse generator 150-4) is applied to the fourth filter 160-4, wherein the SFQ pulse train is filtered to generate a continuous RF signal (RF_4 having a frequency $$f_4 = \frac{1}{\Delta t\_4}.$$

In some embodiments, the first, second, third, and fourth filters 160-1, 160-2, 160-3, and 160-4 are implemented using low pass filters with low cutoff frequencies, wherein each low pass filter is configured to pass a target fundamental frequency component of a respective SFQ pulse train to output a respective continuous RF signal RF_1, RF_2, RF_3, and RF_4, while suppressing the harmonic frequency components. In other embodiments, the first, second, third, and fourth filters 160-1, 160-2, 160-3, and 160-4 are implemented using narrow band bandpass filters, wherein each bandpass filter is configured to pass a single frequency component (single tone) to output a respective continuous RF signal RF_1, RF_2, RF_3, and RF_4, while suppressing other frequency components.

FIG. 1A schematically illustrates an exemplary configuration of the superconducting RF signal generator circuitry 120 comprising four separate channels (or RF signal output channels) including (i) a first RF output channel comprised of the first self-oscillating pulse generator 150-1 and the first filter 160-1, which generates and outputs the first continuous, single frequency RF signal RF_1, (ii) a second RF output channel comprised of the second self-oscillating pulse generator 150-2 and the second filter 160-2, which generates and outputs the second continuous, single frequency RF signal RF_2, (iii) a third RF output channel comprised of the third self-oscillating pulse generator 150-3 and the third filter 160-3, which generates and outputs the third continuous, single frequency RF signal RF_3, and (iv) a fourth RF output channel comprised of the fourth self-oscillating pulse generator 150-4 and the fourth filter 160-4, which generates and outputs the fourth continuous, single frequency RF signal RF_4. In some embodiments, such as shown in FIG. 1A, the RF signals RF_1, RF_2, RF_3, and RF_4 are applied to the respective quantum devices 125-1, 125-2, 125-3, 125-4.

In some embodiments, some or all of the continuous, single frequency RF signals RF_1, RF_2, RF_3, and RF_4 comprise RF signals (e.g., "pump" signals) that are configured to drive or otherwise operate quantum devices such as Josephson junction traveling-wave parametric circuits (e.g., Josephson traveling-wave parametric amplifier (JTWPA) circuits/devices, Josephson traveling-wave frequency converter (JTWFC) circuits/devices, etc.), Josephson ring modulators (JRMs), Josephson parametric amplifiers (JPAs) circuits/devices, other types of quantum-limited amplifier (QLA) circuits/device, active isolator circuits/devices, and other types of quantum devices/circuits that utilize, e.g., pump signals to perform parametric frequency mixing operations or other functions for a given application. In this regard, it is to be noted that the term "quantum device" as used herein broadly refers to different types of superconducting quantum devices or circuits that are driven by RF signals and/or operated using RF signals. In other embodiments, the continuous, single frequency RF signals that are generated by a superconducting RF signal generator can be utilized as clock signals for operating classical digital circuits. For example, in some embodiments, some or all of the continuous, single frequency RF signals RF_1, RF_2, RF_3, and RF_4 comprise local oscillator (LO) signals that are used for driving I/Q mixers for performing modulation and/or demodulation functions.

Figure 1B:
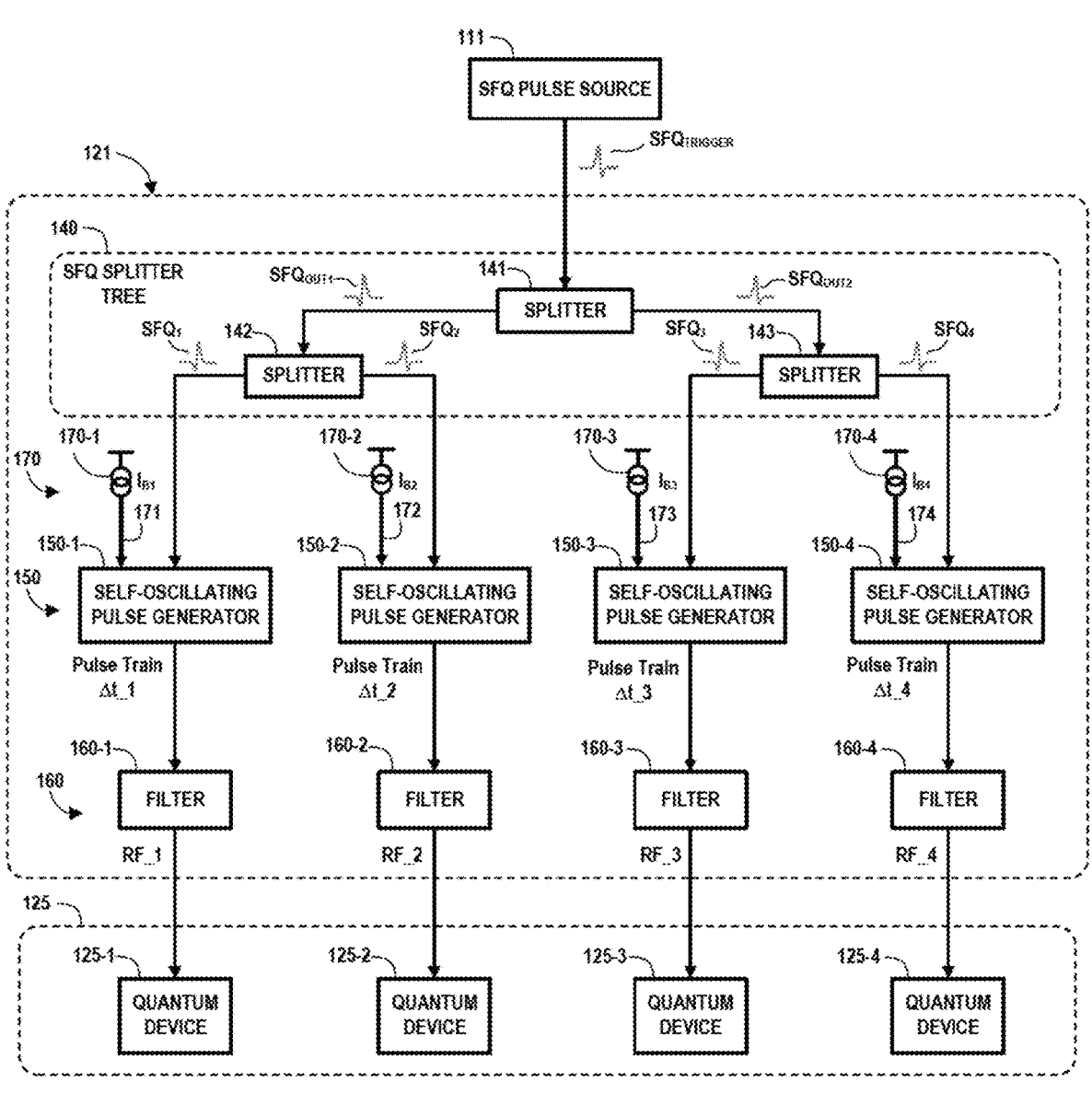
FIG. 1B schematically illustrates a quantum computing system which comprises a superconducting RF signal generator, according to another exemplary embodiment of the disclosure.

Next, FIG. 1B schematically illustrates a quantum computing system which comprises a superconducting RF signal generator, according to another exemplary embodiment of the disclosure. In particular, FIG. 1B schematically illustrates a quantum computing system 101 which is similar to the quantum computing system 100 of FIG. 1A, except that the quantum computing system 101 comprises an SFQ pulse source 111, and superconducting RF signal generator circuitry 121 which is similar to the superconducting RF signal generator circuitry 120 of FIG. 1A, except that the superconducting RF signal generator circuitry 121 does not implement the SFQ pulse generator 130 to generate $SFQ_{OUT}$ in response to $S_{TRIGGER}$. Instead, the operation of the superconducting RF signal generator circuitry 121 is triggered/initiated in response to an SFQ trigger pulse (denoted $SFQ_{TRIGGER}$) that is applied to the input of the SFQ pulse splitter tree 140 from the SFQ pulse source 111. The SFQ pulse source can be any auxiliary control circuit running SFQ logic in the cryogenic environment. In response to $SFQ_{TRIGGER}$, the superconducting RF signal generator circuitry 121 is configured to generate a plurality of continuous RF output signals, e.g., RF_1, RF_2, RF_3, and RF_4, at GHz frequencies, to operate the respective quantum devices 125-1, 125-2, 125-3, and 125-4, in the same manner as the superconducting RF signal generator circuitry 120 of FIG. 1A, the details of which will not be repeated.

Advantageously, the superconducting RF signal generator circuitry 120 of FIG. 1A is configured to generate a plurality of continuous, single frequency, RF signals within a cryostat or dilution refrigerator by transmitting a single 2 rotation of a low-frequency trigger signal $S_{TRIGGER}$ on the single high-bandwidth signal line 112 from the low-frequency trigger signal source 110 disposed in a room temperature environment, to drive the SFQ pulse generator 130. In turn, the SFQ pulse generator 130 generates a single SFQ pulse that triggers the generation of a plurality of continuous, single frequency, RF signals (e.g., RF_1, RF_2, RF_3, and RF_4) to operate respective quantum devices 125-1, 125-2, 125-3, and 125-4.

In this regard, as compared to conventional system architectures where individual high-bandwidth lines would need to be routed from the RT environment to the cryogenic environment to operate each of the quantum devices 125, the superconducting RF signal generator circuitry 120 only needs a single high-bandwidth signal line 112, and individual control lines 171-174 to operate the superconducting RF signal generator circuitry 120 to generate the plurality of continuous, single frequency, RF signals (e.g., RF_1, RF_2, RF_3, and RF_4). For example, in a conventional quantum computing system where RF pump signals are applied to quantum devices such as isolators, JTWPAs, etc., the transmission of individual RF pump signals requires 1-to-1 physical high-bandwidth signal line to transmit the RF pump signals from room temperature electronics to the respective quantum devices in a cryostat, which imparts relatively large heat loads on cryogenic plates in the cryostat.

Moreover, with a conventional quantum system configuration, scaling the number of quantum devices that are operated in a cryogenic temperature environment of a cryostat requires a commensurate scaling of the number of high-bandwidth cables that are required to transmit RF signals from room temperature to the quantum devices in the cryostat. In this regard, scaling the number of high-bandwidth cables that are present in a cryostat not only increases the thermal load in the cryostat, but also results in increased cross-talk between the high-bandwidth signal lines that are routed through the cryostat, which is undesirable.

In contrast, as noted above, the superconducting RF signal generator circuitry 120 only needs a single high-bandwidth signal line 112, and individual control lines 171-174 to operate the superconducting RF signal generator circuitry 120 to generate the plurality of continuous, single frequency, RF signals (e.g., RF_1, RF_2, RF_3, and RF_4). In this regard, the number of high-bandwidth control lines that need to be routed through the cryostat does not scale in proportion to the scaling of the number of quantum devices that are disposed in a cryostat and operated using RF control signals. In addition, the superconducting RF signal generator circuitry 121 of FIG. 1B eliminates the need to route a single high-bandwidth control line from room temperature electronics to and through the cryostat since the operation of the superconducting RF signal generator circuitry 121 is triggered/initiated by an SFQ trigger pulse ($SFQ_{TRIGGER}$) that is generated by a control circuit within the cryostat.

Moreover, despite the use of the individual low-bandwidth control lines (e.g., control lines 171-174) to apply respective DC bias currents to control the operations of the self-oscillating pulse generators 150, the scaling of such low-bandwidth control lines does not pose problems of thermal heat loading and cross talk, as with scaling the high-bandwidth signal lines. Indeed, the transmission of DC signals on low bandwidth control lines causes a minimal or negligible thermal load on the cryostat. Moreover, even with a large number of low-bandwidth control lines, no cross-talk occurs as a result of the DC control bias currents flowing on the low-bandwidth control lines. Thus, scaling the number of low-bandwidth control lines to transmit DC control signals to modulate the RF frequencies being generated by the superconducting RF signal generator disposed in the cryostat, as opposed to scaling the high-bandwidth RF control signal lines, results in very low thermal loading from 300 K to 4K, and allows for low power operation by reducing the quiescent power load needed to operate the quantum device in the cryostat. The ability to demultiplex and tailor RF pump signals for individual quantum devices (e.g., JTWPAs, etc.) with only low bandwidth DC signals is significantly advantageous to scaling quantum systems.

FIG. 3 schematically illustrates a self-oscillating pulse generator circuit, according to an exemplary embodiment of the disclosure. In some embodiments, FIG. 3 schematically illustrates an exemplary embodiment of a self-oscillating pulse generator circuit which can be utilized to implement each of the self-oscillating pulse generators 150 of the superconducting RF signal generator circuitry 120 and 121 of FIGS. 1A and 1B. More specifically, FIG. 3 schematically illustrates a Josephson ring oscillator (JRO) circuit 300 which comprises an input port $P_{IN}$, and output port $P_{OUT}$, a control port $P_{CONT}$, a confluence buffer 310, a first Josephson transmission line 320 (or first JTL 320), a pulse splitter 330, and a second Josephson transmission line 340 (or second JTL 340). Similar to the exemplary mode of operation of the self-oscillating pulse generator 210 as discussed above in conjunction with FIG. 2, the JRO circuit 300 shown in FIG. 3 essentially operates as a high frequency pulse repeater circuit, wherein in response to one SFQ pulse 302 applied to the input port $P_{IN}$, the JRO circuit 300 generates a series of SFQ pulses 304 (or pulse train 304) with a pulse-to-pulse spacing $\Delta t$ (or period of oscillation T) which is a function of the magnitude of a control current (e.g., DC bias current $I_B$) applied to the control signal port $P_{CON}$.

As schematically illustrated in FIG. 3, the confluence buffer 310 comprises a first input port coupled to the input port $P_{IN}$ of the JRO circuit 300, a second input port coupled to an output port of the second JTL 340, and an output port coupled to an input port of the first JTL 320. The first JTL 320 comprises an output port coupled to an input port of the pulse splitter 330. The pulse splitter 330 comprises a first output port coupled to the output port $P_{OUT}$ of the JRO circuit 300, and a second output port coupled to an input port of the second JTL 340. In an exemplary embodiment, the confluence buffer 310, the first JTL 320, the pulse splitter 330, and the second JTL 340 comprise RSFQ circuits.

The confluence buffer 310 is essentially equivalent to a logic OR gate. The confluence buffer 310 is configured to output an SFQ pulse from the output port thereof when an input SFQ pulse arrives at either the first input port or the second input port of the confluence buffer 310. The confluence buffer 310 is configured to prevent an SFQ pulse being output from the second input port when an input SFQ pulse is applied to the first input port, and vice versa. An exemplary embodiment of a circuit architecture of the confluence buffer 310 will be discussed in further detail below in conjunction with FIG. 7.

The first JTL 320 and the second JTL 340 serve as buffers and pulse repeaters. In some embodiments, the first JTL 320 and the second JTL 340 can each be implemented using a two-stage, non-amplifying JTL architecture, an exemplary embodiment of which will be discussed in further detail below in conjunction with FIG. 9. The first JTL 320 is configured to provide a buffer between the output port of the confluence buffer 310 and the input port of the pulse splitter 330. The first JTL 320 serves as an SFQ pulse repeater which is configured to transfer an SFQ pulse from the output port of the confluence buffer 310 to the input port of the pulse splitter 330 (after a short propagation delay). Similarly, the second JTL 340 is configured to provide a buffer in an SFQ pulse feedback path between the second output port of the pulse splitter 330 and the second input port of the confluence buffer 310. The second JTL 340 serves as an SFQ pulse repeater which is configured to transfer an SFQ pulse from the second output port of the pulse splitter 330 to the second input port of the confluence buffer 310, with an adjustable propagation delay (or controllable delay) that is set by the magnitude of the DC control bias current $I_B$ which is applied to the second JTL 340 from the control signal port $P_{CON}$. In this configuration, the second JTL 340 essentially serves a delay circuit with a controllable delay (based on control current $I_B$) that sets the pulse-to-pulse spacing $\Delta t$ of the output SFQ pulses of the pulse train 304.

The JRO circuit 300 operates as follows. When the SFQ pulse 302 is applied to the input port $P_{IN}$, the confluence buffer 310 outputs an SFQ pulse to the input port of the first JTL 320. The first JTL 320 then outputs an SFQ pulse to the input port of the pulse splitter 330. The pulse splitter then concurrently outputs first and second SFQ pulses from the first and second output ports, wherein the first SFQ pulse is output from the output port $P_{OUT}$ of the JRO circuit 300, and the second SFQ pulse is applied to the input port of the second JTL 340. Then, after a given amount of controllable delay as set by the control current $I_B$, the second JTL 340 outputs an SFQ pulse to the second input port of the confluence buffer 310, and the sequence of operations is continuously repeated, wherein the pulse splitter 330 repeatedly outputs an SFQ pulse to the output port $P_{OUT}$ of the JRO circuit 300 and feeds back an SFQ pulse to the second JTL 340 in the feedback loop, which results in the generation of the pulse train 304 at the output port $P_{OUT}$ of the JRO circuit 300 in response to the single SFQ pulse 302 applied to the input port $P_{IN}$ of the JRO circuit 300.

While the confluence buffer 310, the first JTL 320, and the pulse splitter 330 circuits collectively provide some small fixed delay component (on the order of picoseconds) to the pulse-to-pulse spacing $\Delta t$ of the output SFQ pulse train 304, such fixed delay is negligible as compared to the controllable amount of delay that is provided by the second JTL 340 in the feedback path, based on the magnitude of the control current $I_B$ which is adjusted to a target pulse-to-pulse spacing $\Delta t$ of the output SFQ pulse train 304. In the exemplary configuration of the JRO circuit 300, the DC biasing of the second JTL 340 is controlled by the control current $I_B$ such that the second JTL 340 essentially operates as a delay circuit in the feedback path between the output of the pulse splitter 330 and the second input port of the confluence buffer 310, which provides a controllable propagation delay in the feedback path to set the pulse-to-pulse spacing $\Delta t$ of the output SFQ pulse train 304. As the magnitude of the control current $I_B$ increases, the delay period decreases. Conversely, as the magnitude of the control current $I_B$ decreases, the delay period increases.

FIG. 4 schematically illustrates a self-oscillating pulse generator circuit, according to another exemplary embodiment of the disclosure. In some embodiments, FIG. 4 schematically illustrates another exemplary embodiment of a self-oscillating pulse generator circuit which can be utilized to implement each of the self-oscillating pulse generators 150 of the superconducting RF signal generator circuitry 120 and 121 of FIGS. 1A and 1B. More specifically, FIG. 4 schematically illustrates an exemplary JRO circuit 400 which is similar in architecture and operation as the JRO circuit 300 of FIG. 3, except that the JRO circuit 400 further comprises an amplifying Josephson transmission line (AJTL) 410 disposed between the output port of the pulse splitter 330 and an output port $P_{OUT}$ of the JRO circuit 400. As schematically illustrated, the AJTL 410 is configured to amplify the SFQ pulses that are output from the first output port of the pulse splitter 330 to thereby generate an output SFQ pulse train 404 with pulses having larger peak voltage amplitudes (as compared to voltage amplitude of the SFQ pulse train 304 of FIG. 3). The larger pulse amplitudes of the output SFQ pulse train 404 serves to increase the peak-to-peak voltage of the continuous RF signals that are output from the filters 160 (FIGS. 1A and 1B). In some embodiments, the AJTL 410 can be implemented using a two-stage, amplifying JTL architecture, an exemplary embodiment of which will be discussed in further detail below in conjunction with FIG. 10.

Figure 5A:
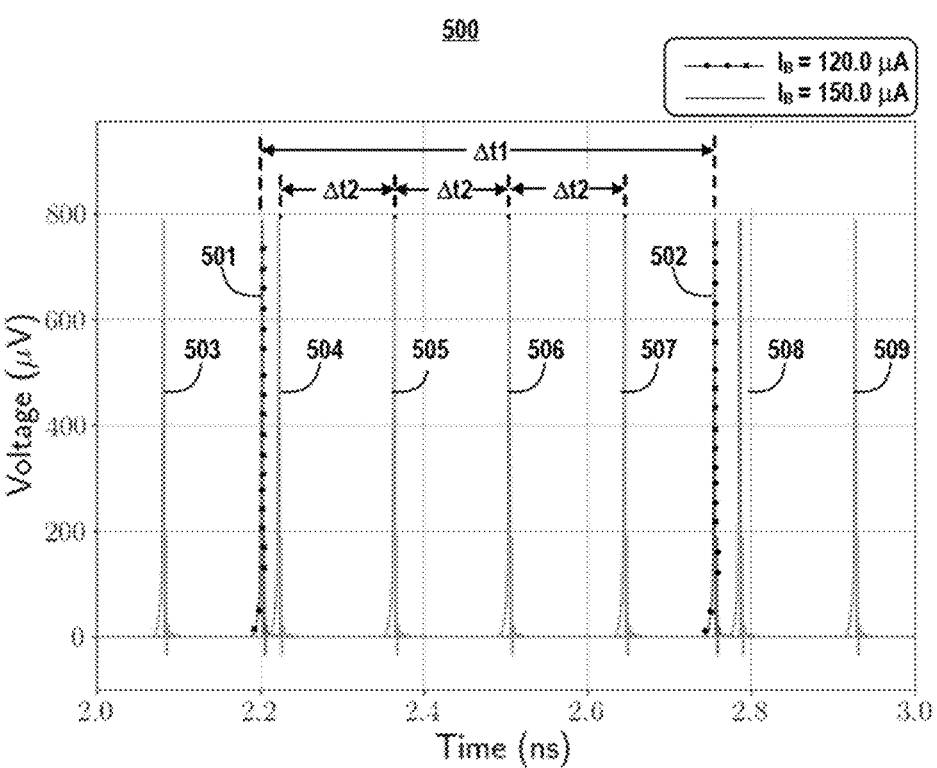
FIGS. 5A, 5B, 5C, and 5D depict simulated waveforms that illustrate exemplary modes of operation of a superconducting RF signal generator, according to an exemplary embodiment of the disclosure.

FIGS. 5A, 5B, 5C, and 5D depict simulated waveforms which illustrate exemplary modes of operation of a superconducting RF signal generator, according to an exemplary embodiment of the disclosure. For example, FIG. 5A is a graph 500 which illustrates simulated SFQ pulse trains (or SFQ time series) in terms of voltage magnitude in microvolts ($\mu V$) (Y-axis) over a time period (X-axis) of 2.0 nanoseconds (ns) to 3.0 ns, which are generated by a self-oscillating pulse generator (having a JRO circuit architecture as shown in FIG. 3) with different magnitude control currents $I_B$ applied to the self-oscillating pulse generator. In particular, FIG. 5A illustrates a first simulated train of SFQ pulses 501 and 502 having a first pulse-to-pulse spacing of $\Delta t1 = 0.55$ ns, which results from applying a control current of $I_B = 120.0$ microamps ($\mu A$) to the second JTL 340 (FIG. 3). In addition, FIG. 5A illustrates a second simulated train of SFQ pulses 503, 504, 505, 506, 507, 508, and 509 having a second pulse-to-pulse spacing of $\Delta t2=0.14$ ns which results from applying a control current of $I_B=150.0$ µA to the second JTL 340. FIG. 5A illustrates that a larger magnitude control current $I_B$ (e.g., $I_B=150.0$ µA) results in a smaller pulse-to-pulse spacing (e.g., $\Delta t2=0.14$ ns) and, conversely, a smaller magnitude control current $I_B$ (e.g., $I_B=120.0$ µA) results in a larger pulse-to-pulse spacing (e.g., $\Delta t1=0.55$ ns).

Figure 5B:
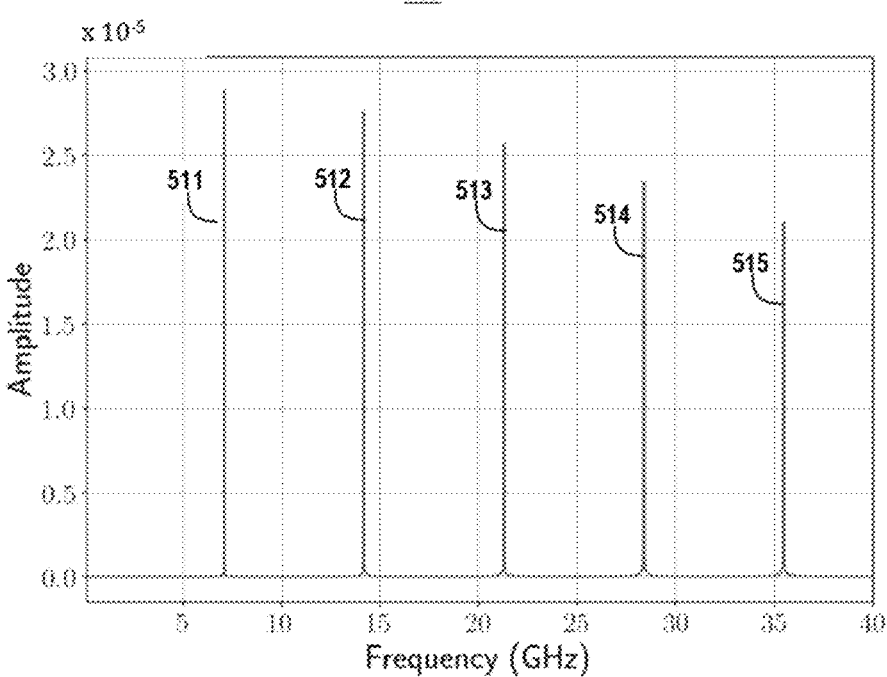

Next, FIG. 5B is a graph 510 which illustrates a simulated Fast Fourier Transform (FFT) of the exemplary SFQ pulse train (SFQ time series) comprising the series of SFQ pulses 503-509 with the pulse-to-pulse spacing of $\Delta t2=0.14$ ns for the control current $I_B=150.0$ µA. FIG. 5B illustrates various frequency components 511, 512, 513, 514, and 515 of the exemplary SFQ pulse train over a frequency range from 0 to 40 GHz (X-axis). The frequency component 511 corresponds to a fundamental frequency ($f_1$) 7.0 GHz, which corresponds to the pulse-to-pulse spacing of $\Delta t2=0.14$ ns (e.g., where $$7.0 \text{ GHz} = \frac{1}{\Delta t2}).$$

The frequency components 512, 513, 514, and 515 correspond to harmonics of the fundamental frequency $f_1$. In particular, the frequency components 512, 513, 514, and 515 correspond to frequencies of $2f_1$, $3f_1$, $4f_1$, and $5f_1$, respectively. In summary, FIG. 5B illustrates that a time series of SFQ pulses in the time domain (FIG. 5) corresponds to a series of pulses in the frequency domain which are all separated by a fundamental frequency which corresponds to the pulse-to-pulse spacing $\Delta t$ of the SFQ pulses.

Figure 5C:
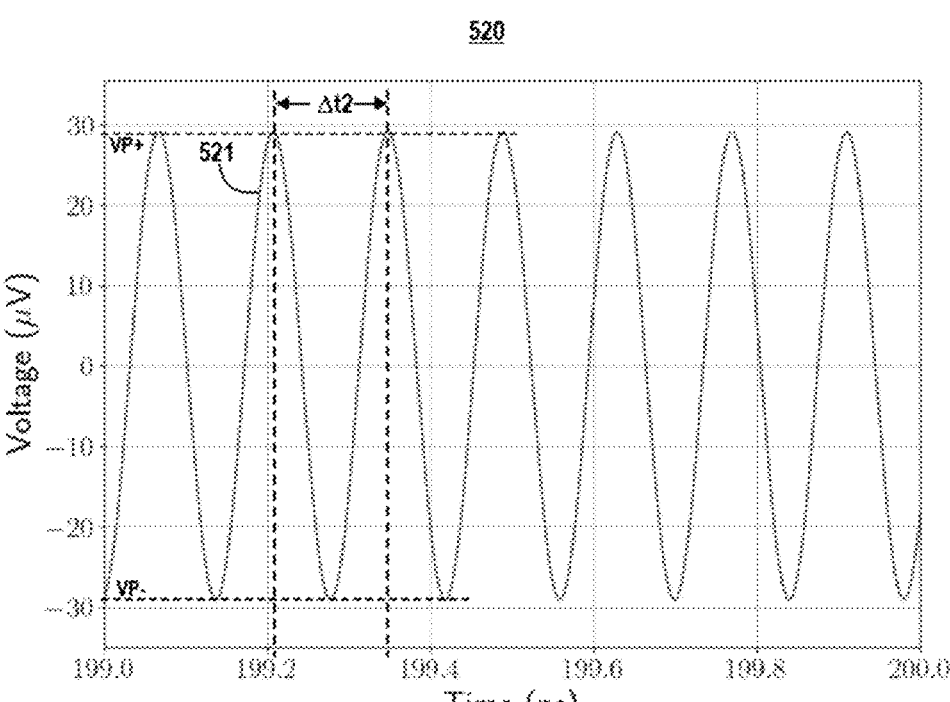

Next, FIG. 5C is a graph 520 which illustrates a simulated filtered waveform 521 which is generated by filtering the exemplary train of SFQ pulses 503-509 (FIG. 5A) having the pulse-to-pulse spacing of $\Delta t2$. The exemplary simulated filtered waveform 521 comprises a peak-to-peak voltage of about 60 µV (e.g., VP+ of about +30 µV and VP− of about −30 µV). In addition, the exemplary simulated filtered waveform 521 has a period of $\Delta t2=0.14$ ns, which corresponds to a frequency of 7.0 GHz. In an exemplary embodiment, the simulated filtered waveform 521 represents a continuous RF signal with a frequency of 7.0 GHz, which is output from a given one of the filters 160 of FIG. 1A or FIG. 1B.

Figure 5D:
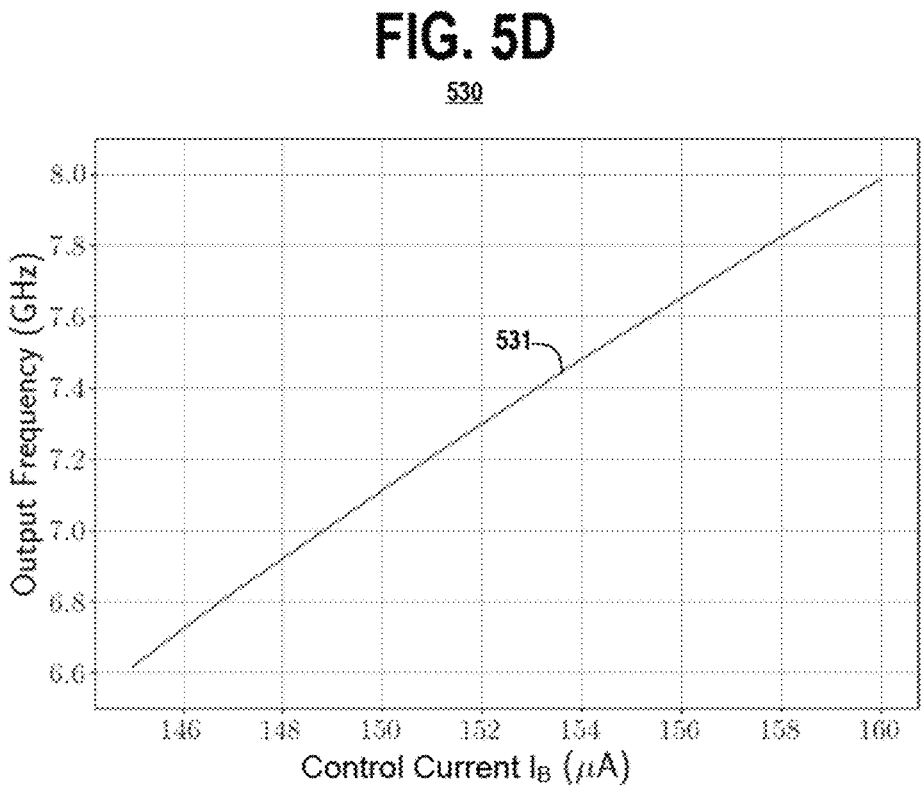

FIG. 5D is a graph 530 which depicts a simulated curve 531 that represents the fundamental output frequency in GHz (Y-axis) of a continuous RF signal which is generated and output from a given RF output channel of, e.g., the superconducting RF signal generator circuitry 120 of FIG. 1A, as function as a function of the magnitude in µA (X-axis) of a control current $I_B$ applied to a self-oscillating pulse generator (e.g., JRO circuit) in the given RF output channel. FIG. 5D shows that as the control current $I_B$ is swept from 145 µA to 160 µA, the frequency of the continuous RF signal that is generated increases from 6.6 GHz to 8 GHz. Moreover, the simulated curve 531 shows that the change in the fundamental output RF frequency is linear as a function of the change in the control current $I_B$, and that a given self-oscillating pulse generator has a relatively large tunable bandwidth (e.g., at least 6.6 GHz to 8.0 GHz), although other simulations have shown that a self-oscillating pulse generator having the JRO architecture shown in FIG. 3 has a tunable bandwidth of at least 3 GHz (e.g., from 6.5 GHz to 9.0 GHz) or more.

Figure 6:
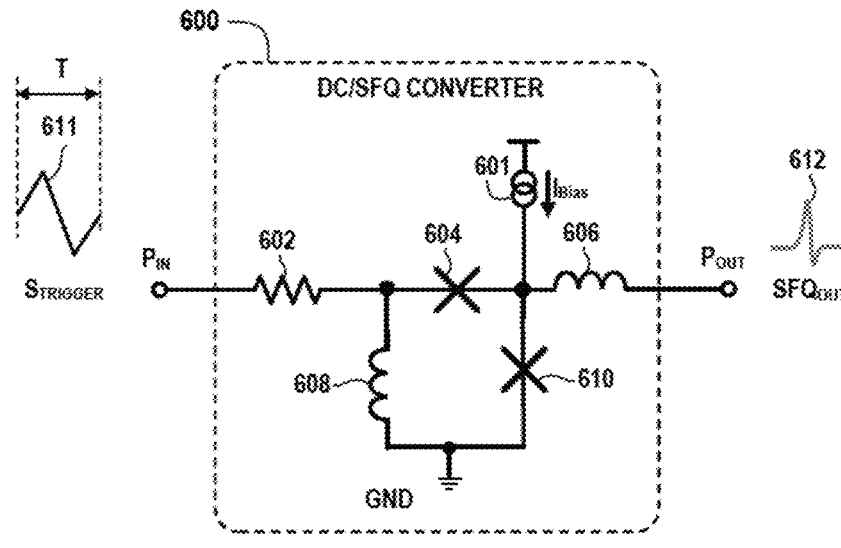
FIG. 6 schematically illustrates an SFQ pulse generator circuit which can be implemented in a superconducting RF signal generator, according to an exemplary embodiment of the disclosure.

FIG. 6 schematically illustrates an SFQ pulse generator circuit, according to an exemplary embodiment of the disclosure. In some embodiments, FIG. 6 schematically illustrates an exemplary embodiment of the SFQ pulse generator 130 of the superconducting RF signal generator circuitry 120 of FIG. 1A. More specifically, FIG. 6 schematically illustrates a DC/SFQ converter circuit 600 which comprises an input port $P_{IN}$, an output port $P_{OUT}$, a DC current bias circuit 601, a resistor 602, a first Josephson junction 604, a first superconducting inductor 606, a second superconducting inductor 608, and a second Josephson junction 610. The resistor 602, the first Josephson junction 604, and the first superconducting inductor 606 are serially connected between the input port $P_{IN}$ and the output port $P_{OUT}$. The second superconducting inductor 608 and the second Josephson junction 610 have terminals that are coupled to the ground node GND.

The DC/SFQ converter circuit 600 is configured to receive one cycle (one $2\pi$ rotation) of a low-frequency trigger signal $S_{TRIGGER}$ at the input port $P_{IN}$ and, in response, generates a single SFQ pulse ($SFQ_{OUT}$) on the output port $P_{OUT}$. The DC/SFQ converter circuit 600 shown in FIG. 6 comprises a known DC/SFQ converter circuit architecture, the operating details of which are well-known and understood by those of ordinary skill in the art. The exemplary DC/SFQ converter circuit 600 is capable of generating SFQ pulses over a wide range of input frequencies, starting at very low frequencies (e.g., 1 Hz), which are effectively DC signals as compared to the high frequency of the SFQ pulses, up to relatively high frequencies (e.g., 10 GHz). In an exemplary embodiment, as schematically shown in FIG. 6, a low-frequency trigger signal 611 having a triangular-shaped waveform with a period T that corresponds to a frequency in range of, e.g., 1 Hz to 1 kHz, can be applied to the input port $P_{IN}$ to generate the single SFQ pulse 612 at the output port $P_{OUT}$. As noted above, to enable operation of the superconducting RF signal generator circuitry 120 of FIG. 1A, the input port $P_{IN}$ of the DC/SFQ converter circuit 600 is not continuously driven with an RF signal, but rather is driven with a single 2× rotation (e.g., one period) of the low-frequency trigger signal 611 $S_{TRIGGER}$ to generate a single SFQ pulse 612 which, in turn, triggers the operation of the superconducting RF signal generator circuitry 120 (FIG. 1A) to generate a plurality of continuous RF output signals (e.g., RF_1, RF_2, RF_3, and RF_4).

Figure 7:
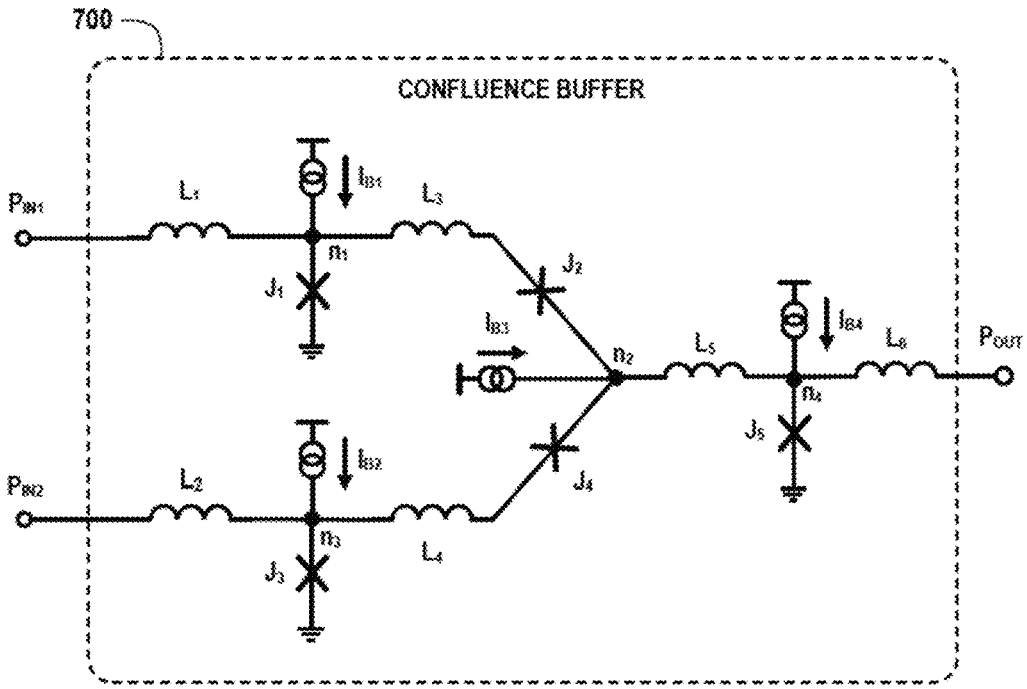
FIG. 7 schematically illustrates a confluence buffer circuit which can be implemented in a self-oscillating pulse generator circuit of a superconducting RF signal generator, according to an exemplary embodiment of the disclosure.

Next, FIG. 7 schematically illustrates a confluence buffer circuit, according to an exemplary embodiment of the disclosure. In some embodiments, FIG. 7 schematically illustrates an exemplary embodiment of a confluence buffer circuit 700 which can be utilized to implement the confluence buffer 310 of the JRO circuits 300 and 400 of FIGS. 3 and 4. The confluence buffer circuit 700 comprises a first input port $P_{IN1}$, a second input port $P_{IN2}$, an output port $P_{OUT}$, a plurality of inductors $L_1$, $L_2$, $L_3$, $L_4$, $L_5$, and $L_6$, and a plurality of Josephson junctions $J_1$, $J_2$, $J_3$, $J_4$, and $J_5$. A plurality of DC bias current sources are implemented to generate bias currents $I_{B1}$, $I_{B2}$, $I_{B3}$, and $I_{B4}$ for biasing the Josephson junctions $J_1$, $J_2$, $J_3$, $J_4$, and $J_5$ as needed for proper operation of the confluence buffer circuit 700.

In operation, when an SFQ pulse arrives at the first input port $P_{IN1}$, the SFQ pulse causes the Josephson junction $J_1$ to be temporarily driven above its critical current $I_C$ which, in turn, causes the Josephson junction $J_1$ to switch to a voltage state and generate an SFQ pulse at node $n^1$. The Josephson junction $J_2$ does not switch and remains in the superconducting state, so that the SFQ pulse generated across $J_1$ at node $n_1$ propagates to node $n^2$ and is applied to the inductor $L_5$. The resulting pulse through $L_5$ causes the Josephson junction $J_5$ to switch to a voltage state, whereby an SFQ pulse appears at node $n^4$ which propagates to output port $P_{OUT}$. In addition, the Josephson junction $J_4$ switches so that the SFQ pulse does not propagate to the second input port $P_{IN2}$. Therefore, an SFQ pulse at the first input port $P_{IN1}$ causes the Josephson junctions $J_1$, $J_4$, and $J_5$ to sequentially switch in a way that essentially transfers the SFQ pulse at the first input port $P_{IN1}$ to the output port $P_{OUT}$, while preventing an SFQ pulse from being generated at the second input port $P_{IN2}$.

Similarly, when an SFQ pulse arrives at the second input port $P_{IN2}$, the SFQ pulse causes the Josephson junction $J_3$ to be temporarily driven above its critical current $I_C$ which, in turn, causes the Josephson junction $J_3$ to switch to a voltage state and generate an SFQ pulse at node $n^3$. The Josephson junction $J_4$ does not switch and remains in the superconducting state, so that the SFQ pulse generated across $J_3$ at node $n^3$ propagates to node $n^2$ and is applied to the inductor $L_5$. The resulting pulse through $L_5$ causes the Josephson junction $J_5$ to switch to a voltage state, whereby an SFQ pulse appears at node $n^4$ which propagates to the output port $P_{OUT}$. In addition, the Josephson junction $J_2$ switches so that the SFQ pulse does not propagate to the first input port $P_{IN1}$. Therefore, an SFQ pulse at the second input port $P_{IN2}$ causes the Josephson junctions $J_3$, $J_2$, and $J_5$ to sequentially switch in a way that essentially transfers the SFQ pulse at the second input port $P_{IN2}$ to the output port $P_{OUT}$, while preventing an SFQ pulse from being generated at the first input port $P_{IN1}$.

Figure 8:
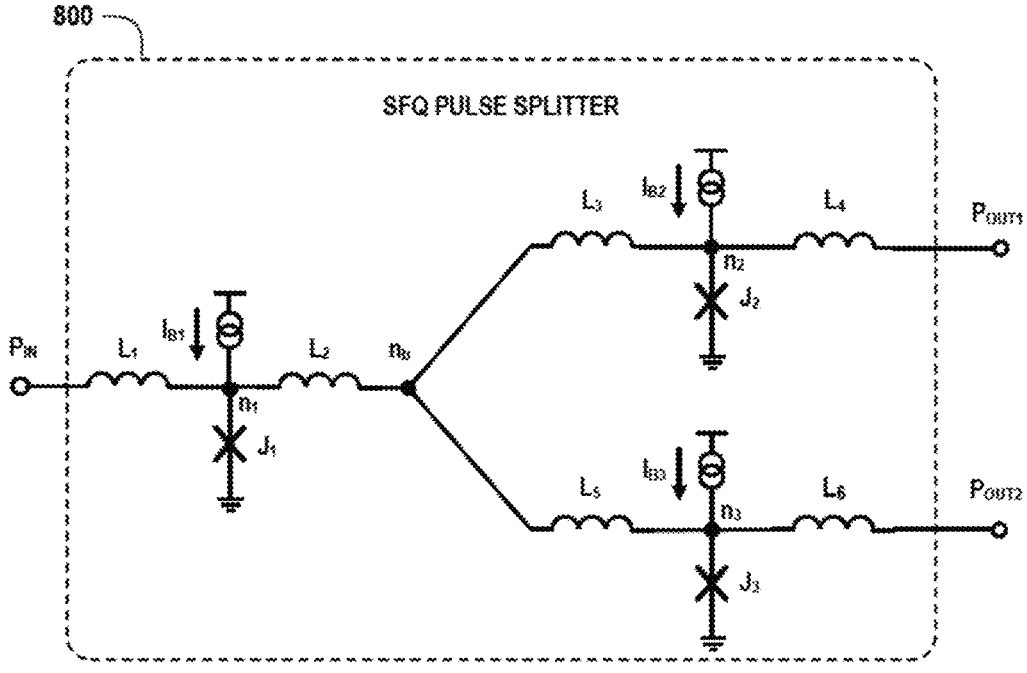
FIG. 8 schematically illustrates an SFQ pulse splitter circuit which can be implemented in a superconducting RF signal generator, according to an exemplary embodiment of the disclosure.

Next, FIG. 8 schematically illustrates an SFQ pulse splitter circuit, according to an exemplary embodiment of the disclosure. In some embodiments, FIG. 8 schematically illustrates an exemplary embodiment of an SFQ pulse splitter circuit 800 which can be utilized to implement the pulse splitters of the SFQ pulse splitter tree 140 (FIGS. 1A and 1B) and the pulse splitter 330 of the JRO circuits 300 and 400 (FIGS. 3 and 4). The SFQ pulse splitter circuit 800 comprises an input port $P_{IN}$, a first output port $P_{OUT1}$, a second output port $P_{OUT2}$, a plurality of inductors $L_1$, $L_2$, $L_3$, $L_4$, $L_5$, and $L_6$, and a plurality of Josephson junctions $J_1$, $J_2$, and $J_3$. A plurality of DC bias current sources are implemented to generate bias currents $I_{B1}$, $I_{B2}$, and $I_{B3}$ for biasing the Josephson junctions $J_1$, $J_2$, and $J_3$ as needed for proper operation of the SFQ pulse splitter circuit 800.

In operation, when an SFQ pulse arrives at the input port $P_{IN}$, the SFQ pulse causes the Josephson junction $J_1$ to be temporarily driven above its critical current $I_C$ which, in turn, causes the Josephson junction $J_1$ to switch to a voltage state and generate an SFQ pulse at node $n^1$. The SFQ pulse at node $n^1$ propagates through the inductor $L_2$ to a branch node $n_b$, wherein the SFQ pulse at the node $n_b$ causes both of the Josephson junctions $J_2$ and $J_3$ (in separate output branches) to concurrently switch into a voltage state. The concurrent switching of the Josephson junctions $J_2$ and $J_3$ causes an SFQ pulse to be generated at node $n^2$ and at node $n^3$, which propagate to the respective first and second output ports $P_{OUT1}$ and $P_{OUT2}$, wherein SFQ pulses are concurrently output from $P_{OUT1}$ and $P_{OUT2}$. It is to be noted that the critical currents of the Josephson junctions $J_1$, $J_2$, and $J_3$ are designed in a way that allows the switching of the Josephson junction $J_1$ to drive the concurrent switching of the Josephson junctions $J_1$ and $J_2$, as is readily understood by those of ordinary skill in the art.

Figure 9:
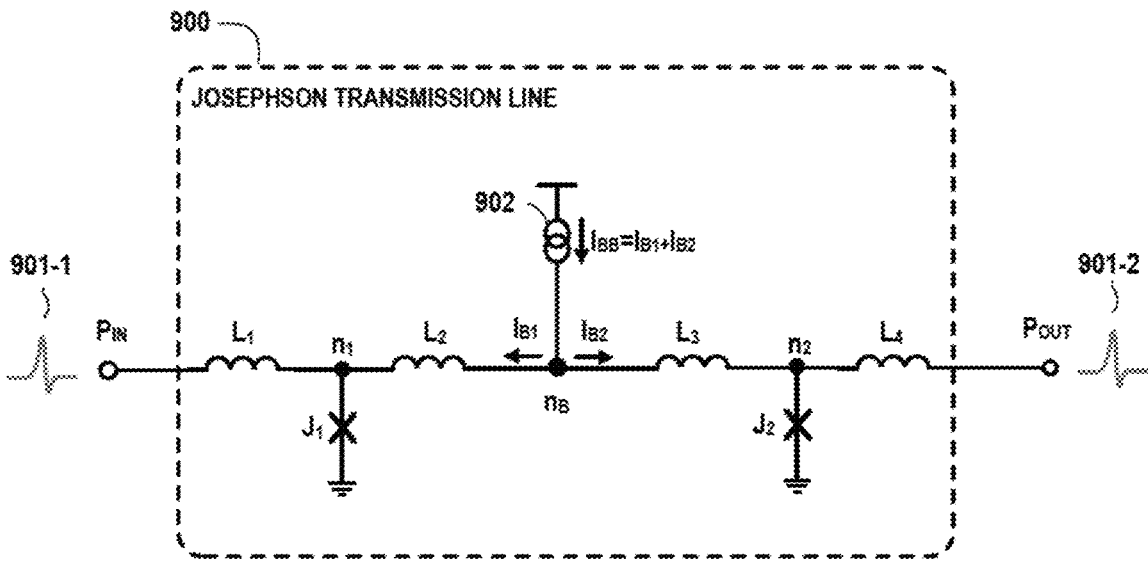
FIG. 9 schematically illustrates a Josephson transmission line which can be implemented in a self-oscillating pulse generator circuit of a superconducting RF signal generator, according to an exemplary embodiment of the disclosure.

Next, FIG. 9 schematically illustrates a Josephson transmission line, according to an exemplary embodiment of the disclosure. In some embodiments, FIG. 9 schematically illustrates an exemplary embodiment of a Josephson transmission line 900 (JTL 900) which can be utilized to implement the first JTL 320 and the second JTL 340 of the JRO circuits 300 and 400 (FIGS. 3 and 4). The JTL 900 comprises an input port $P_{IN}$, an output port $P_{OUT}$, a DC bias circuit 902, superconducting inductors $L_1$, $L_2$, $L_3$, and $L_4$, and Josephson junctions $J_1$ and $J_2$. The JTL 900 comprises a multi-stage JTL buffer circuit comprising a first stage which comprises the first Josephson junction $J_1$ and the superconducting (non-quantizing) inductor $L_2$, and a second stage which comprises the second Josephson junction $J_2$ and the superconducting (non-quantizing) inductor $L_3$.

The DC bias circuit 902 is a current bias source that is connected to node $n_B$ (bias current injection node) between superconducting inductors $L_2$, and $L_3$. The node np is an output node of the first JTL stage and an input node of the second JTL stage. While the DC bias circuit 902 is generically depicted in FIG. 9, it is to be understood that the DC bias circuit 902 can be implemented using a resistor for an RSFQ bias circuit or implemented using an ERSFQ bias circuit, as is known in the art.

The superconducting inductors $L_1$, $L_2$, $L_3$, and $L_4$ are designed to have relatively low inductance values such that the superconducting inductors $L_1$, $L_2$, $L_3$, and $L_4$ are non-quantizing inductors to ensure that (i) no magnetic flux quanta can be stored/trapped between the JTL stages and that (ii) an input SFQ pulse 901-1 results in a relatively high magnitude circulating current to cause the successive switching of the Josephson junctions $J_1$ and $J_2$.

As shown in FIG. 9, the input SFQ pulse 901-1 applied to the input port $P_{IN}$ generates a circulating current which causes the first Josephson junction $J_1$ to be temporarily driven above its critical current $I_C$ which, in turn, causes the Josephson junction $J_1$ to switch and generate an SFQ pulse at node $n_1$. The SFQ pulse at node $n_1$ generates a circulating current which causes the second Josephson junction $J_2$ to be temporarily driven above its critical current $I_C$ which, in turn, causes the second Josephson junction $J_2$ to switch and generate an SFQ pulse at node $n_2$, which result in an SFQ pulse 901-2 at the output port $P_{OUT}$. The JTL 900 essentially operates as an SFQ pulse repeater, wherein the input SFQ pulse 901-1 is actively regenerated by each Josephson junction $J_1$ and $J_2$ at each node $n_1$ and $n_2$, in succession, after a short propagation delay.

In the exemplary configuration, the first and second JTL stages are both powered by the same DC bias circuit 902. In particular, the DC bias circuit 902 is configured to generate a bias current $I_{BB}$ which is injected into node $n_B$, wherein the bias current $I_{BB}$ divides to provide a first bias current $I_{B1}$ to bias the first Josephson junction $J_1$, and a second bias current $I_{B2}$ to bias the second Josephson junction $J_2$. In this configuration, the superconducting inductors $L_2$ and $L_3$ form an inductive current divider circuit which is configured to divide the bias current $I_{BB}$ into the first and second bias currents $I_{B1}$ and $I_{B2}$ according to an inductance ratio, between the inductance of the superconducting inductor $L_2$ in series with the Josephson junction $J_1$, and the inductance of the superconducting inductor $L_3$ in series with the Josephson junction $J_2$. In some embodiments, where $L_2$ and $L_3$ have the same or substantially the same inductance, the first and second bias currents $I_{B1}$ and $I_{B2}$ will be substantially the same.

In an exemplary embodiment where the first JTL 320 of the JRO circuits 300 and 400 (FIGS. 3 and 4) is implemented using the exemplary architecture of the JTL 900 as shown in FIG. 9, the DC bias circuit 902 would be a fixed current source that is configured to generate a fixed bias current $I_{BB}$ to bias the Josephson junctions $J_1$ and $J_2$. On the other hand, in an exemplary embodiment where the second JTL 340 of the JRO circuits 300 and 400 (FIGS. 3 and 4) is implemented using the exemplary architecture of the JTL 900 as shown in FIG. 9, the DC bias circuit 902 would be a variable current source that is configured to generate a variable bias current $I_{BB}$ to adjust the biassing of Josephson junctions $J_1$ and $J_2$ as desired to change the propagation delay of the SFQ pulse through the JTL 900. As noted above, the second JTL 340 provides a controllable delay that is set by the magnitude of the DC control bias current $I_B$ which is applied to the second JTL 340, wherein the controllable delay is utilized to adjust the pulse-pulse spacing between the SFQ pulses in the SFQ pulse train that is generated by the JRO circuits 300 and 400.

Figure 10:
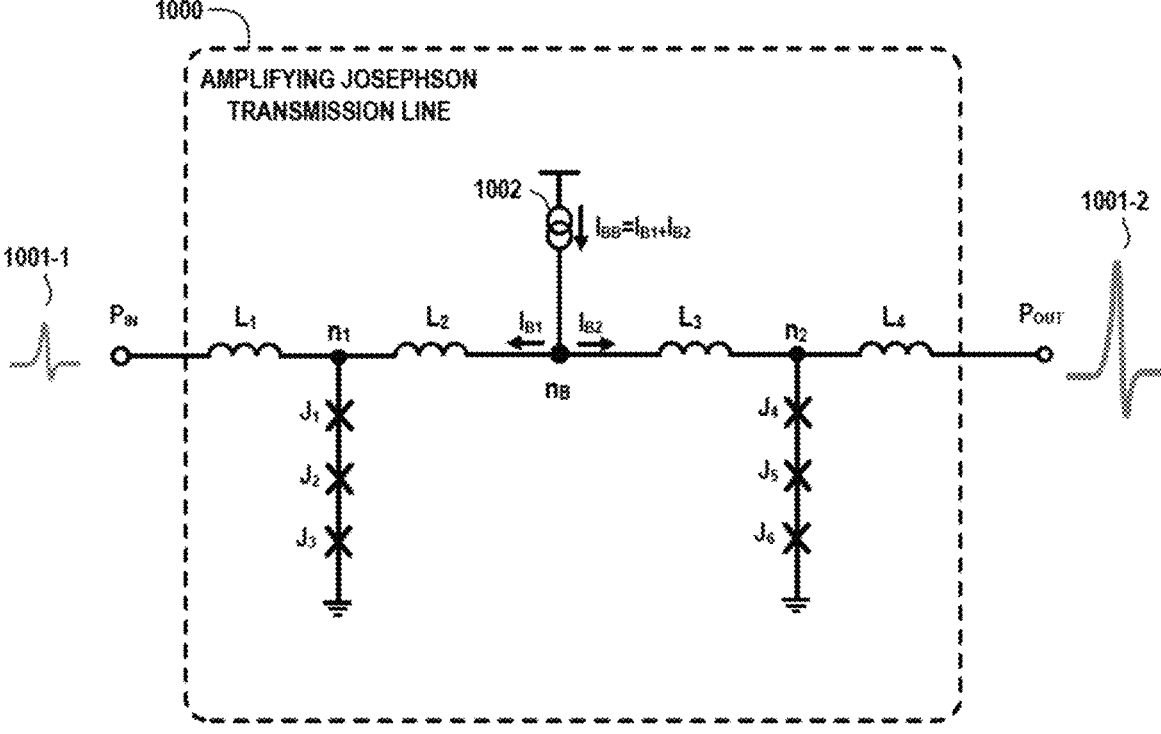
FIG. 10 schematically illustrates an amplifying Josephson transmission line which can be implemented in a self-oscillating pulse generator circuit of a superconducting RF signal generator, according to an exemplary embodiment of the disclosure.

Next, FIG. 10 schematically illustrates an amplifying Josephson transmission line, according to an exemplary embodiment of the disclosure. In some embodiments, FIG. 10 schematically illustrates an exemplary embodiment of an amplifying Josephson transmission line 1000 (AJTL 1000) which can be utilized to implement the AJTL 410 of the JRO circuit 400 (FIG. 4). The AJTL 1000 is similar in architecture and operation of the JTL 900 of FIG. 9, except that the AJTL 1000 comprises (i) a plurality of serially connected Josephson junctions $J_1$, $J_2$, and $J_3$ between the node $n_1$ and ground. In operation, an SFQ pulse 1001-1 applied to the input port $P_{IN}$ generates a circulating current which causes the Josephson junctions $J_1$, $J_2$, and $J_3$ to be temporarily driven above their critical currents $I_C$ which, in turn, causes the Josephson junctions $J_1$, $J_2$, and $J_3$ to concurrently switch to a voltage state and thereby generate an amplified SFQ pulse at node $n_1$. In turn, the amplified SFQ pulse at node $n_1$ generates a circulating current which causes the Josephson junctions $J_4$, $J_5$, and $J_6$ to be temporarily driven above their critical currents $I_C$ which, in turn, causes each of the Josephson junctions $J_4$, $J_5$, and $J_6$ to concurrently switch to a voltage state and thereby generate an amplified SFQ pulse at node $n_2$. The amplified SFQ pulse at node $n_2$ propagates to the output node $P_{OUT}$, and is output as an amplified SFQ pulse 1001-2 which, as shown in FIG. 10, has a larger voltage amplitude than the input SFQ pulse 1001-1.

It is to be noted by implementing the AJTL 410, the JRO circuit 400 of FIG. 4 generates an SFQ pulse train with SFQ pulses that have greater voltage magnitudes as compared the voltage magnitudes of the SFQ pulses of the SFQ pulse train generated by the exemplary JRO circuit 300 of FIG. 3 (which essentially provides unity gain). In this regard, when using the JRO circuit 400 with the AJTL 410 at the output, the exemplary simulated filtered waveform 521 as shown in FIG. 5C could have a peak-to-peak voltage of about 180 μV (e.g., VP+ of about +90 μV and VP− of about −90 μV) for the same period of $\Delta t2$=0.14 ns, which corresponds to a frequency of 7.0 GHz.

FIG. 11 schematically illustrates a quantum computing system which comprises superconducting RF signal generator circuitry, according to an exemplary embodiment of the disclosure. FIG. 11 schematically illustrates a quantum computing system 1100 which comprises a quantum computing platform 1110, a control system 1120, a multi-stage dilution refrigeration system 1130 (or cryostat) within which is disposed various superconducting quantum devices and circuitry including, e.g., superconducting qubit control and readout circuitry 1140, superconducting RF signal generator circuitry 1150, and a quantum processing unit (QPU) 1160. The quantum processing unit 1160 comprises one or more solid-state quantum chips which comprise, e.g., a superconducting qubit array 1162, and a network 1164 of qubit drive lines, coupler flux-bias control lines, qubit readout resonators, and other circuit QED components that may be needed for a given application or quantum system configuration.

In some embodiments, the quantum computing platform 1110 implements a software platform that is configured to program a quantum computer to execute quantum information processing algorithms 1112 which are implemented using, e.g., quantum circuits which define computational routines consisting of coherent quantum operations that are performed on quantum data that is stored in qubits of the superconducting qubit array 1162. Further, in some embodiments, the quantum computing platform 1110 implements software control programs to control the functions and operations of the control system 1120.

In some embodiments, the control system 1120 comprises a multi-channel arbitrary waveform generator (AWG) 1122, a qubit readout control system 1124, and low frequency and DC control signal generators 1126. In some embodiments, the control system 1120 implements electronics that are operated at room temperature (e.g., 300 K). On the other hand, the superconducting qubit control and readout circuitry 1140, the superconducting RF signal generator circuitry 1150, and the quantum processing unit 1160 are disposed at different stages of the multi-stage dilution refrigeration system 1130 which can generate cryogenic temperatures, as needed, to operate the superconducting qubit control and readout circuitry 1140, the superconducting RF signal generator circuitry 1150, and the quantum processing unit 1160 for quantum computing applications.

For example, the quantum processing unit 1160 may need to be cooled down to near-absolute zero, e.g., 10-15 millikelvin (mK), to allow the superconducting qubits to exhibit quantum behaviors. Moreover, in some embodiments, various quantum components of the superconducting qubit control and readout circuitry 1140 (e.g., isolators, circulators, quantum limited amplifiers, filters, I/Q mixers, etc.), and the superconducting RF signal generator circuitry 1150 need to be cooled down to temperatures below 4K, or below 100 mK, etc. It is to be noted that the superconducting RF signal generator circuitry 1150 can be implemented using the exemplary embodiments as discussed in conjunction with, e.g., FIGS. 1-4 and 6-10.

In some embodiments, the superconducting qubit array 1162 comprises a quantum system of superconducting qubits, superconducting qubit couplers, and other components commonly utilized to support quantum processing using qubits. The number of superconducting qubits of the superconducting qubit array 1162 can be on the order of tens, hundreds, thousands, or more, etc. The network 1164 of qubit drive lines, coupler flux bias control lines, and qubit readout resonators, etc., is configured to apply microwave control signals to superconducting qubits and coupler circuitry in the superconducting qubit array 1162 to perform various types of gate operations, e.g., single-gate operations, entanglement gate operations, perform error correction operations, etc., as well as read the quantum states of the superconducting qubits. For example, microwave control pulses can be selectively applied to the qubit drive lines of respective superconducting qubits to change the quantum state of the superconducting qubits (e.g., change the quantum state of a given qubit between the ground state and excited state, or to a superposition state) when executing quantum information processing algorithms.

In some embodiments, the multi-channel AWG 1122 is configured to generate microwave control pulses that are applied to the qubit drive lines, and the coupler drive lines to control the operation of the superconducting qubits and associated qubit coupler circuitry, when performing various gate operations to execute a given certain quantum information processing algorithm. In some embodiments, the multi-channel AWG 1122 comprises a plurality of AWG channels, where each channel is configured to generate microwave control pulses to control respective superconducting qubits of the superconducting qubit array 1162. In some embodiments, each AWG channel comprises a baseband signal generator, a digital-to-analog converter (DAC) stage, a filter stage, a quadrature I/Q modulation stage, an impedance matching network, and a phase-locked loop system to generate local oscillator (LO) signals (e.g., quadrature LO signals LO_I and LO_Q) for the respective modulation stages of the respective AWG channels.

In some embodiments, the multi-channel AWG 1122 comprises a quadrature AWG system which is configured to process quadrature signals, wherein a quadrature signal comprises an in-phase (I) signal component, and a quadrature-phase (Q) signal component. In each AWG channel the baseband signal generator is configured to receive baseband data as input (e.g., from the quantum computing platform), and generate digital quadrature signals I and Q which represent the input baseband data. In this process, the baseband data that is input to the baseband signal generator for a given AWG channel is separated into two orthogonal digital components including an in-phase (I) baseband component and a quadrature-phase (Q) baseband component. The baseband signal generator for the given AWG channel will generate the requisite digital quadrature baseband IQ signals which are needed to generate an analog waveform (e.g., sinusoidal voltage waveform) with a target center frequency that is configured to operate or otherwise control a given quantum bit that is coupled to the output of the given AWG channel.

The DAC stage for the given AWG channel is configured to convert a digital baseband signal (e.g., a digital IQ signal output from the baseband signal generator) to an analog baseband signal (e.g., analog baseband signals I (t) and Q (t)) having a baseband frequency. The filter stage for the given AWG channel is configured to filter the IQ analog signal components output from the DAC stage to thereby generate filtered analog IQ signals. The modulation stage for the given AWG channel is configured to perform analog IQ signal modulation (e.g., single-sideband (SSB) modulation) by mixing the filtered analog signals I (t) and Q (t), which are output from the filter stage, with quadrature LO signals (e.g., an in-phase LO signal (LO_I) and a quadrature-phase LO signal (LO_Q)) to generate and output an analog RF signal (e.g., a single-sideband modulated RF output signal).

The qubit readout control system 1124 is configured to generate RF readout control signals, which are applied to readout resonators of superconducting qubits in the qubit array 1162, to readout the quantum states of the superconducting qubits using a dispersive readout scheme which enables quantum non-demolition measurements of the quantum states of the superconducting qubits. In an exemplary embodiment, the qubit readout control system 1124 receives and processes readout control signals from a control process executing on the quantum computing platform 1110. The qubit readout control system 1124 comprises various components that can operate at room temperature including, e.g., a waveform generator, DAC circuitry, low-pass filter circuitry, I/Q mixers, and LO signal generators, and hardware or software-based discriminators to determine the readout states of the superconducting qubits. Other components of the qubit readout control system 1124 include qubit readout circuitry (e.g., circuit components of superconducting qubit control and readout circuitry 1140) such as readout resonators, Purcell filters, isolator circuits, directional couplers, JTWPA circuit, filters, high-electron-mobility-transistor (HEMT) amplifiers, etc., which operate in a cryogenic temperature environment.

The superconducting RF signal generator circuitry 1150 can be implemented using one or more instances of the superconducting RF signal generator circuitry 120 schematically shown in FIG. 1A and/or the superconducting RF signal generator circuitry 121 schematically shown in FIG. 1B. The superconducting RF signal generator circuitry 1150 is controlled by low frequency RF signals and DC control signals generated and transmitted on control lines from the low frequency and DC control signal generators 1126 (at room temperature) to the superconducting RF signal generator circuitry 1150. The low frequency and DC control signal generators 1126 are configured to (i) generate low frequency RF control signals that are applied to SFQ pulse generators of the superconducting RF signal generators to initiate the operations of the superconducting RF signal generators, and (ii) generate the DC bias control signals that are applied to the self-oscillating pulse generators of various RF output channels to controllably set the pulse-to-pulse spacing of the SFQ pulse trains and thereby set the frequency of the RF output signals generated by the superconducting RF signal generators, using exemplary techniques as discussed above. As schematically illustrated in FIG. 11, the RF output signals generated by the superconducting RF signal generator circuitry 1150 can be utilized to control quantum devices and circuitry of the superconducting qubit control and readout circuitry 1140 and/or the quantum processing unit 1160.

The quantum computing platform 1110 comprises a software and hardware platform which comprises various software layers that are configured to perform various functions, including, but not limited to, generating and implementing various quantum applications using suitable quantum programming languages, configuring and implementing various quantum gate operations, compiling quantum programs into a quantum assembly language, implementing and utilizing a suitable quantum instruction set architecture (ISA), performing calibration operations to calibrate the quantum circuit elements and gate operations, etc. In addition, the quantum computing platform 1110 comprises a hardware architecture of processors, memory, etc., which is configured to control the execution of quantum applications, and interface with the control system 1120 to (i) generate digital control signals that are converted to analog microwave control signals by the control system 1120, to control operations of the quantum processing unit 1160 when executing a given quantum application, and (ii) to obtain and process digital signals received from the control system 1120, which represent processing results that are generated as a result of the quantum processing unit 1160 executing various qubit gate operations for a given quantum application.

Figure 12:
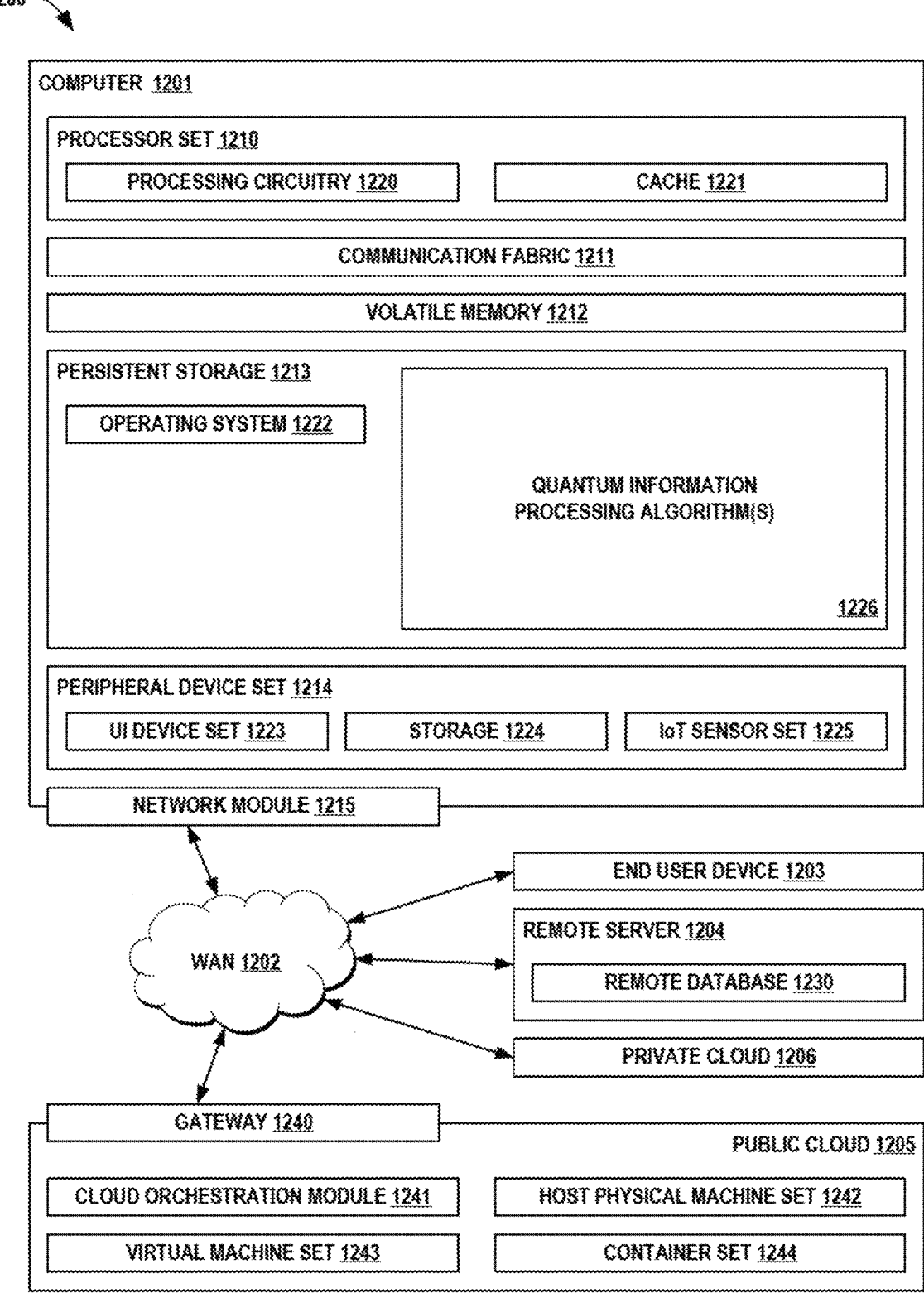
FIG. 12 schematically illustrates an exemplary architecture of a computing environment for hosting a quantum computing platform, according to an exemplary embodiment of the disclosure.

In some exemplary embodiments, the quantum computing platform 1110 of the quantum computing system 1100 may be implemented using any suitable computing system architecture (e.g., as shown in FIG. 12) which is configured to implement methods to support quantum computing operations by executing computer readable program instructions that are embodied on a computer program product which includes a computer readable storage medium (or media) having such computer readable program instructions thereon for causing a processor to perform control methods as discussed herein.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random-access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 1200 of FIG. 12 contains an example of an environment for the execution of at least some of the computer code (block 1226) involved in executing quantum information algorithms (e.g., quantum computing algorithms, and signal routing control processes). In addition to block 1226, computing environment 1200 includes, for example, computer 1201, wide area network (WAN) 1202, end user device (EUD) 1203, remote server 1204, public cloud 1205, and private cloud 1206. In this embodiment, computer 1201 includes processor set 1210 (including processing circuitry 1220 and cache 1221), communication fabric 1211, volatile memory 1212, persistent storage 1213 (including operating system 1222 and block 1226, as identified above), peripheral device set 1214 (including user interface (UI), device set 1223, storage 1224, and Internet of Things (IoT) sensor set 1225), and network module 1215. Remote server 1204 includes remote database 1230. Public cloud 1205 includes gateway 1240, cloud orchestration module 1241, host physical machine set 1242, virtual machine set 1243, and container set 1244.

Computer 1201 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 1230. As is well understood in the art of computer technology, and depending upon the technology, performance of a computer-implemented method may be distributed among multiple computers and/or between multiple locations. On the other hand, in this presentation of computing environment 1200, detailed discussion is focused on a single computer, specifically computer 1201, to keep the presentation as simple as possible. Computer 1201 may be located in a cloud, even though it is not shown in a cloud in FIG. 12. On the other hand, computer 1201 is not required to be in a cloud except to any extent as may be affirmatively indicated.

Processor set 1210 includes one, or more, computer processors of any type now known or to be developed in the future. Processing circuitry 1220 may be distributed over multiple packages, for example, multiple, coordinated integrated circuit chips. Processing circuitry 1220 may implement multiple processor threads and/or multiple processor cores. Cache 1221 is memory that is located in the processor chip package(s) and is typically used for data or code that should be available for rapid access by the threads or cores running on processor set 1210. Cache memories are typically organized into multiple levels depending upon relative proximity to the processing circuitry. Alternatively, some, or all, of the cache for the processor set may be located "off chip." In some computing environments, processor set 1210 may be designed for working with qubits and performing quantum computing.

Computer readable program instructions are typically loaded onto computer 1201 to cause a series of operational steps to be performed by processor set 1210 of computer 1201 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 1221 and the other storage media discussed below. The program instructions, and associated data, are accessed by processor set 1210 to control and direct performance of the inventive methods. In computing environment 1200, at least some of the instructions for performing the inventive methods may be stored in block 1226 in persistent storage 1213.

Communication fabric 1211 comprises the signal conduction paths that allow the various components of computer 1201 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

Volatile memory 1212 is any type of volatile memory now known or to be developed in the future. Examples include dynamic type random access memory (RAM) or static type RAM. Typically, the volatile memory is characterized by random access, but this is not required unless affirmatively indicated. In computer 1201, the volatile memory 1212 is located in a single package and is internal to computer 1201, but, alternatively or additionally, the volatile memory may be distributed over multiple packages and/or located externally with respect to computer 1201.

Persistent storage 1213 is any form of non-volatile storage for computers that is now known or to be developed in the future. The non-volatility of this storage means that the stored data is maintained regardless of whether power is being supplied to computer 1201 and/or directly to persistent storage 1213. Persistent storage 1213 may be a read only memory (ROM), but typically at least a portion of the persistent storage allows writing of data, deletion of data and re-writing of data. Some familiar forms of persistent storage include magnetic disks and solid-state storage devices. Operating system 1222 may take several forms, such as various known proprietary operating systems or open source Portable Operating System Interface type operating systems that employ a kernel. The code included in block 1226 typically includes at least some of the computer code involved in performing the inventive methods.

Peripheral device set 1214 includes the set of peripheral devices of computer 1201. Data communication connections between the peripheral devices and the other components of computer 1201 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 1223 may include components such as a display screen, speaker, microphone, wearable devices (such as goggles and smart watches), keyboard, mouse, printer, touchpad, game controllers, and haptic devices. Storage 1224 is external storage, such as an external hard drive, or insertable storage, such as an SD card. Storage 1224 may be persistent and/or volatile. In some embodiments, storage 1224 may take the form of a quantum computing storage device for storing data in the form of qubits. In embodiments where computer 1201 is required to have a large amount of storage (for example, where computer 1201 locally stores and manages a large database) then this storage may be provided by peripheral storage devices designed for storing very large amounts of data, such as a storage area network (SAN) that is shared by multiple, geographically distributed computers. IoT sensor set 1225 is made up of sensors that can be used in Internet of Things applications. For example, one sensor may be a thermometer and another sensor may be a motion detector.

Network module 1215 is the collection of computer software, hardware, and firmware that allows computer 1201 to communicate with other computers through WAN 1202. Network module 1215 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 1215 are performed on the same physical hardware device. In other embodiments (for example, embodiments that utilize software-defined networking (SDN)), the control functions and the forwarding functions of network module 1215 are performed on physically separate devices, such that the control functions manage several different network hardware devices. Computer readable program instructions for performing the inventive methods can typically be downloaded to computer 1201 from an external computer or external storage device through a network adapter card or network interface included in network module 1215.

WAN 1202 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

End user device (EUD) 1203 is any computer system that is used and controlled by an end user (for example, a customer of an enterprise that operates computer 1201), and may take any of the forms discussed above in connection with computer 1201. EUD 1203 typically receives helpful and useful data from the operations of computer 1201. For example, in a hypothetical case where computer 1201 is designed to provide a recommendation to an end user, this recommendation would typically be communicated from network module 1215 of computer 1201 through WAN 1202 to EUD 1203. In this way, EUD 1203 can display, or otherwise present, the recommendation to an end user. In some embodiments, EUD 1203 may be a client device, such as thin client, heavy client, mainframe computer, desktop computer and so on.

Remote server 1204 is any computer system that serves at least some data and/or functionality to computer 1201. Remote server 1204 may be controlled and used by the same entity that operates computer 1201. Remote server 1204 represents the machine(s) that collect and store helpful and useful data for use by other computers, such as computer 1201. For example, in a hypothetical case where computer 1201 is designed and programmed to provide a recommendation based on historical data, then this historical data may be provided to computer 1201 from remote database 1230 of remote server 1204.

Public cloud 1205 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 1205 is performed by the computer hardware and/or software of cloud orchestration module 1241. The computing resources provided by public cloud 1205 are typically implemented by virtual computing environments that run on various computers making up the computers of host physical machine set 1242, which is the universe of physical computers in and/or available to public cloud 1205. The virtual computing environments (VCEs) typically take the form of virtual machines from virtual machine set 1243 and/or containers from container set 1244. It is understood that these VCEs may be stored as images and may be transferred among and between the various physical machine hosts, either as images or after instantiation of the VCE. Cloud orchestration module 1241 manages the transfer and storage of images, deploys new instantiations of VCEs and manages active instantiations of VCE deployments. Gateway 1240 is the collection of computer software, hardware, and firmware that allows public cloud 1205 to communicate through WAN 1202.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Private cloud 1206 is similar to public cloud 1205, except that the computing resources are only available for use by a single enterprise. While private cloud 1206 is depicted as being in communication with WAN 1202, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 1205 and private cloud 1206 are both part of a larger hybrid cloud.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, and to enable others of ordinary skill in the art to understand the embodiments disclosed herein.

What is claimed is:

1. A device, comprising a superconducting radio frequency (RF) signal generator which comprises a plurality of channels, wherein each channel is configured to generate a corresponding RF signal with a frequency that is controlled by a corresponding direct current (DC) control signal applied to the channel.

2. The device of claim 1, wherein the superconducting RF signal generator comprises:
a pulse generator circuit configured to generate a control pulse in response to one cycle of an RF control signal applied to the pulse generator circuit; and
a pulse splitter tree configured to split and distribute the control pulse to an input of each channel;
wherein in response to the control pulse, each channel is configured to: generate a series of pulses with a pulse-to-pulse spacing that is based on a magnitude of the corresponding DC control signal applied to the channel, and to filter the series of pulses to generate an RF signal with a frequency that corresponds to the pulse-to-pulse spacing of the series of pulses.

3. The device of claim 2, wherein the pulse generator circuit is configured to generate a single flux quantum (SFQ) pulse as the control pulse.

4. The device of claim 2, wherein each channel is configured to generate a series of SFQ pulses in response to the control pulse input to the channel.

5. The device of claim 1, wherein each channel comprises:
a self-oscillating pulse generator circuit that is configured to generate a series of pulses with a pulse-to-pulse spacing that is based on a magnitude of the corresponding DC control signal applied to the channel; and
a filter circuit that is configured to filter the series of pulses generated by the self-oscillating pulse generator circuit, and output a RF signal with a single frequency that corresponds to the pulse-to-pulse spacing of the series of pulses.

6. The device of claim 5, wherein:
the self-oscillating pulse generator circuit comprises a Josephson ring oscillator circuit which is configured to generate a series of single flux quantum (SFQ) pulses with the pulse-to-pulse spacing that is based on the magnitude of the corresponding DC control signal applied to the channel; and
the corresponding DC control signal is input to the Josephson ring oscillator circuit to cause the Josephson ring oscillator circuit to set the pulse-to-pulse spacing based on the magnitude of the corresponding DC control signal.

7. The device of claim 6, wherein:
the Josephson ring oscillator circuit comprises: a pulse input port; a pulse output port; a control signal port; a confluence buffer circuit; a first Josephson transmission line; a second Josephson transmission line; and a pulse splitter circuit;
the confluence buffer circuit comprises a first input port coupled to the pulse input port of the Josephson ring oscillator circuit, a second input port coupled to an output port of the second Josephson transmission line, and an output port coupled to an input port of the first Josephson transmission line;
the first Josephson transmission line comprises an output port coupled to an input port of the pulse splitter circuit;
the pulse splitter circuit comprises a first output port coupled to the pulse output port of the Josephson ring oscillator circuit, and a second output port coupled to an input port of the second Josephson transmission line; and
the control signal port of the Josephson ring oscillator circuit is coupled to a bias current input port of the second Josephson transmission line, and configured to receive the corresponding DC control signal.

8. The device of claim 1, wherein at least one channel of the plurality of channels is configured to generate a corresponding RF signal which is applied to an input of a quantum device.

9. A device, comprising:
a plurality of superconducting quantum devices; and
a superconducting radio frequency (RF) signal generator, which comprises:
a plurality of channels;
a pulse generator circuit configured to generate a single flux quantum (SFQ) control pulse in response to one cycle of an RF control signal applied to the pulse generator circuit;

a pulse splitter tree configured to split and distribute the SFQ control pulse to an input of each channel of the plurality of channels of the superconducting RF signal generator;

wherein in response to the SFQ control pulse, each channel is configured to: generate a series of SFQ pulses with a pulse-to-pulse spacing that is based on a magnitude of a corresponding DC control signal that is applied to the channel; filter the series of SFQ pulses to generate a RF signal with a frequency that corresponds to the pulse-to-pulse spacing of the series of SFQ pulses; and apply the RF signal to at least one superconducting quantum device of the plurality of superconducting quantum devices.

10. The device of claim 9, wherein each channel of the superconducting RF signal generator comprises:

a self-oscillating pulse generator circuit which, in response to the SFQ control pulse, is configured to generate the series of SFQ pulses with the pulse-to-pulse spacing that is based on the magnitude of the corresponding DC control signal applied to the channel; and a filter circuit that is configured to filter the series of SFQ pulses generated by the self-oscillating pulse generator circuit, and output an RF signal with a frequency that corresponds to the pulse-to-pulse spacing of the series of SFQ pulses.

11. The device of claim 10, wherein:

the self-oscillating pulse generator circuit comprises a Josephson ring oscillator circuit; and the corresponding DC control signal comprises a DC bias current that is input to the Josephson ring oscillator circuit to cause the Josephson ring oscillator circuit to set the pulse-to-pulse spacing of the series of SFQ pulses based on the magnitude of the DC bias current.

12. The device of claim 11, wherein:

the Josephson ring oscillator circuit comprises: a pulse input port; a pulse output port; a control signal port; a confluence buffer circuit; a first Josephson transmission line; a second Josephson transmission line; and a pulse splitter circuit;

the confluence buffer circuit comprises a first input port coupled to the pulse input port of the Josephson ring oscillator circuit, a second input port coupled to an output port of the second Josephson transmission line, and an output port coupled to an input port of the first Josephson transmission line;

the first Josephson transmission line comprises an output port coupled to an input port of the pulse splitter circuit;

the pulse splitter circuit comprises a first output port coupled to the pulse output port of the Josephson ring oscillator circuit, and a second output port coupled to an input port of the second Josephson transmission line; and the control signal port of the Josephson ring oscillator circuit is coupled to a bias current input port of the second Josephson transmission line, and configured to receive the corresponding DC control signal.

13. The device of claim 9, wherein at least one channel of the plurality of channels is configured to generate a corresponding RF signal which is applied to an input of the at least one superconducting quantum device of the plurality of superconducting quantum devices, which is coupled to the at least one channel.

14. A system, comprising:

a plurality of superconducting quantum devices;

a superconducting radio frequency (RF) signal generator; and a control system which is coupled to the superconducting RF signal generator by an RF control line and a plurality of direct current (DC) control lines, and which is configured to control operation of the superconducting RF signal generator;

wherein the superconducting RF signal generator comprises:

a plurality of channels;

a pulse generator circuit configured to generate a single flux quantum (SFQ) control pulse in response to one cycle of an RF control signal which is generated by the control system and applied to the pulse generator circuit on the RF control line;

a pulse splitter tree configured to split and distribute the SFQ control pulse to an input of each channel of the plurality of channels of the superconducting RF signal generator;

wherein in response to the SFQ control pulse, each channel is configured to: generate a series of SFQ pulses with a pulse-to-pulse spacing that is based on a magnitude of a corresponding DC control signal that is applied to the channel on a corresponding DC control line of the plurality of DC control lines; filter the series of SFQ pulses to generate a RF signal with a frequency that corresponds to the pulse-to-pulse spacing of the series of SFQ pulses; and apply the RF signal to at least one superconducting quantum device of the plurality of superconducting quantum devices.

15. The system of claim 14, wherein:

the plurality of superconducting quantum devices and the superconducting RF signal generator are disposed in a cryogenic temperature environment, and the control system is disposed in a non-cryogenic temperature environment.

16. The system of claim 14, wherein at least one channel of the plurality of channels of the superconducting RF signal generator is configured to generate a corresponding RF signal which is applied to an input of the at least one superconducting quantum device of the plurality of superconducting quantum devices, which is coupled to the at least one channel.

17. The system of claim 14, wherein each channel of the superconducting RF signal generator comprises:

a self-oscillating pulse generator circuit which, in response to the SFQ control pulse, is configured to generate the series of SFQ pulses with the pulse-to-pulse spacing that is based on the magnitude of the corresponding DC control signal applied to the channel on the corresponding DC control line; and a filter circuit that is configured to filter the series of SFQ pulses generated by the self-oscillating pulse generator circuit, and output an RF signal with a frequency that corresponds to the pulse-to-pulse spacing of the series of SFQ pulses.

18. The system of claim 17, wherein:

the self-oscillating pulse generator circuit comprises a Josephson ring oscillator circuit; and the corresponding DC control signal comprises a DC bias current that is input to the Josephson ring oscillator circuit to cause the Josephson ring oscillator circuit to set the pulse-to-pulse spacing of the series of SFQ pulses based on the magnitude of the DC bias current.

19. The system of claim 18, wherein:

the Josephson ring oscillator circuit comprises: a pulse input port; a pulse output port; a control signal port; a confluence buffer circuit; a first Josephson transmission line; a second Josephson transmission line; and a pulse splitter circuit;

the confluence buffer circuit comprises a first input port coupled to the pulse input port of the Josephson ring oscillator circuit, a second input port coupled to an output port of the second Josephson transmission line, and an output port coupled to an input port of the first Josephson transmission line;

the first Josephson transmission line comprises an output port coupled to an input port of the pulse splitter circuit;

the pulse splitter circuit comprises a first output port coupled to the pulse output port of the Josephson ring oscillator circuit, and a second output port coupled to an input port of the second Josephson transmission line; and the control signal port of the Josephson ring oscillator circuit is coupled to a bias current input port of the second Josephson transmission line, and configured to receive the corresponding DC control signal.

20. The system of claim 18, wherein the Josephson ring oscillator circuit is configured to amplify the series of SFQ pulses.

\* \* \* \* \*